(12) United States Patent
Lee et al.

(10) Patent No.: US 10,269,777 B2
(45) Date of Patent: Apr. 23, 2019

(54) DISPLAY APPARATUS COMPRISING REFLECTION STRUCTURE

(71) Applicant: Innolux Corporation, Miao-Li County (TW)

(72) Inventors: Kuan-Feng Lee, Miao-Li County (TW); Shun-Yuan Hu, Miao-Li County (TW); Tsau-Hua Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/585,175

(22) Filed: May 3, 2017

(65) Prior Publication Data

US 2017/0336690 A1  Nov. 23, 2017

Related U.S. Application Data

(60) Provisional application No. 62/339,107, filed on May 20, 2016, provisional application No. 62/350,169, filed on Jun. 14, 2016.

(30) Foreign Application Priority Data

Jan. 5, 2017 (CN) .......................... 2017 1 0007030

(51) Int. Cl.
*H01L 25/075* (2006.01)

(52) U.S. Cl.
CPC ................. *H01L 25/0753* (2013.01)

(58) Field of Classification Search
CPC ......... G01S 19/13; G06F 1/3203; G06F 21/32
See application file for complete search history.

(56) References Cited

U.S. PATENT DOCUMENTS

| 2014/0339495 A1* | 11/2014 | Bibl | ...................... H01L 33/504 257/13 |
| 2014/0367705 A1* | 12/2014 | Bibl | ........................ H01L 33/44 257/88 |
| 2016/0299279 A1* | 10/2016 | Uehara | ................ G02B 6/0055 |
| 2016/0370631 A1* | 12/2016 | Tang | ................... G02F 1/13394 |

* cited by examiner

*Primary Examiner* — Chun-Nan Lin
(74) *Attorney, Agent, or Firm* — JCIPRNET

(57) ABSTRACT

A display apparatus includes a first substrate, a light emitting device and a first reflection structure. The light emitting device is disposed on the first substrate, wherein a height of the light emitting device is equal to or greater than 1 μm, and less than or equal to 20 μm. The first reflection structure is disposed corresponding to the light emitting device, wherein a light emitted by the light emitting device is reflected by the first reflection structure, and then emitted from the first substrate.

15 Claims, 20 Drawing Sheets

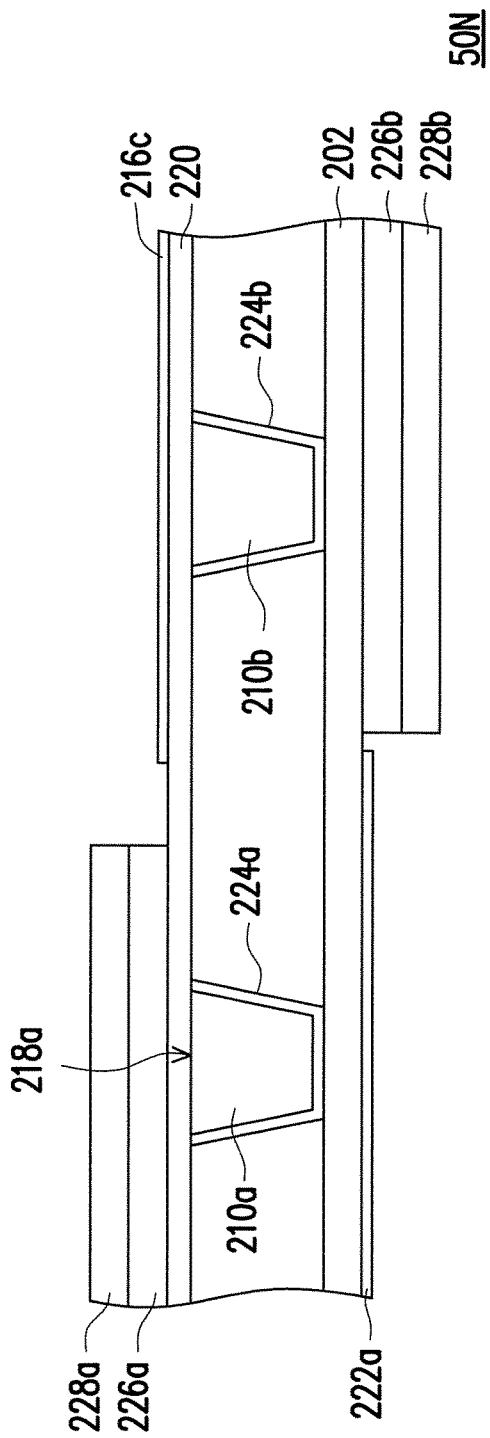
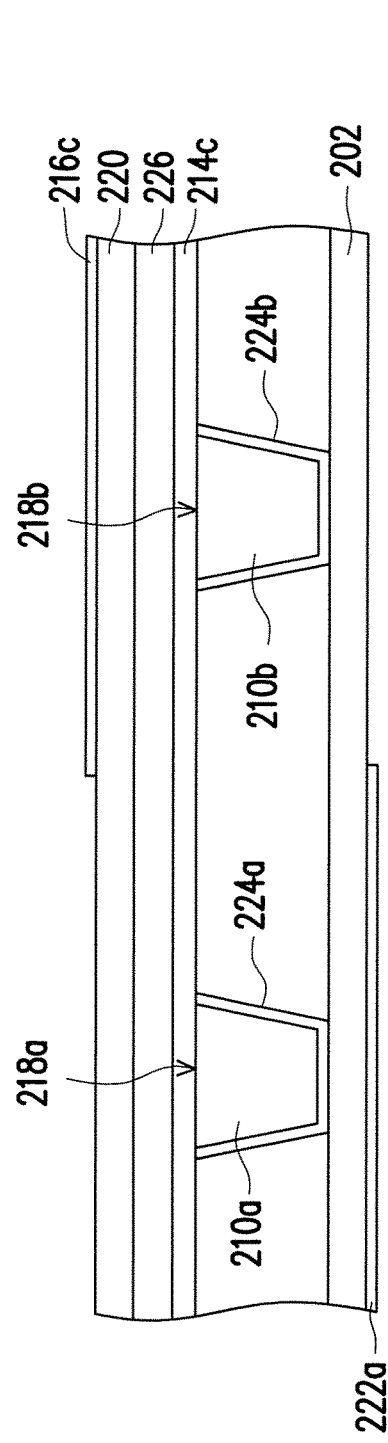
FIG. 14
FIG. 15

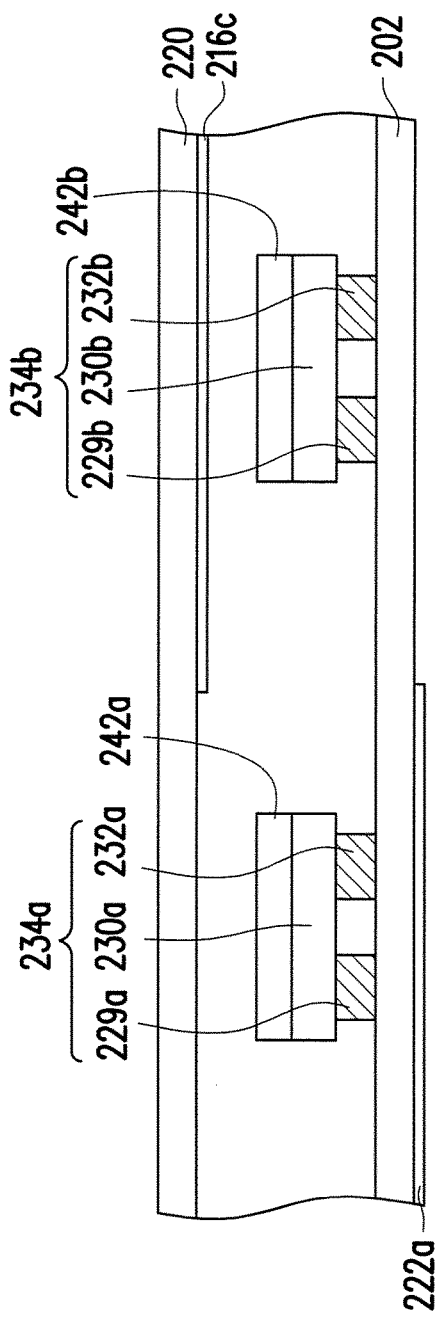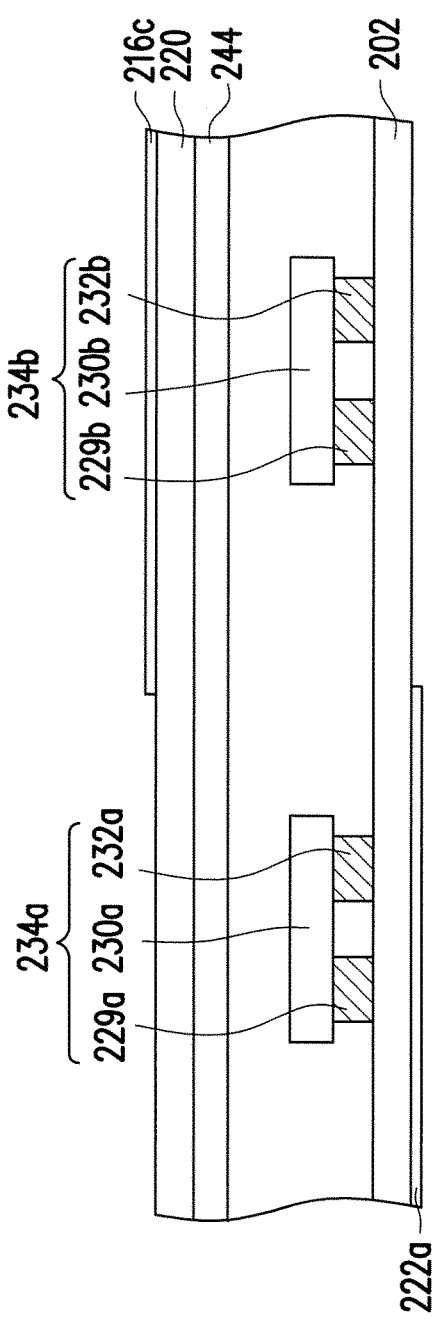

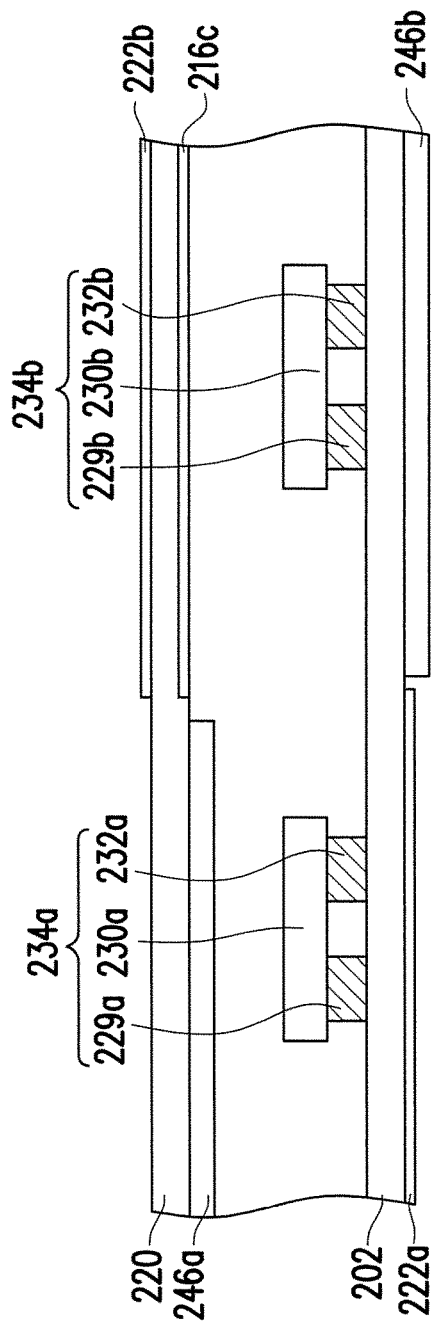
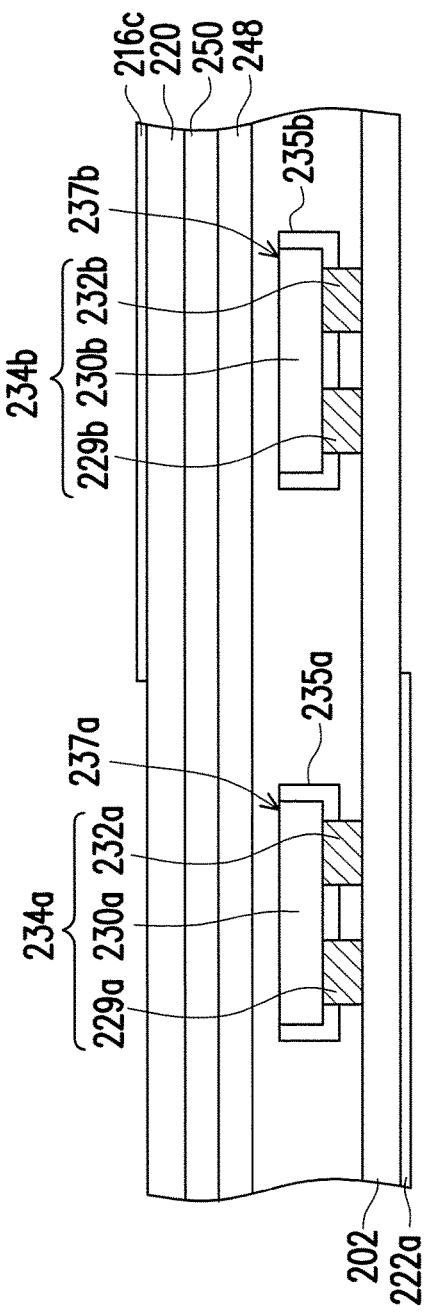

DISPLAY APPARATUS COMPRISING REFLECTION STRUCTURE

CROSS-REFERENCE TO RELATED APPLICATION

This application claims the priority benefits of U.S. provisional application Ser. No. 62/339,107, filed on May 20, 2016, U.S. provisional application Ser. No. 62/350,169, filed on Jun. 14, 2016, and China application serial no. 201710007030.9, filed on Jan. 5, 2017. The entirety of each of the above-mentioned patent applications is hereby incorporated by reference herein and made a part of this specification.

BACKGROUND OF THE DISCLOSURE

Technical Field

The disclosure relates to a display apparatus, and more particularly, to a display apparatus having a reflection structure.

Description of Related Art

A light emitting diode (LED) display apparatus has advantages such as active light emission, high brightness, high contrast, low power consumption, and has advantages such as longer lifespan as compared to an organic light emitting diode (OLED) display apparatus. Therefore, in recent years, LED display apparatus has become one of the most extensively developed technologies for new type displays. To meet the need of high resolution, LED display apparatus is being developed toward a direction to be composed of an active device array substrate and micron-sized LEDs arranged in an array.

SUMMARY

The disclosure provides a display apparatus, which can be applied to a large area display apparatus or a double-sided display apparatus.

The display apparatus of the disclosure includes a first substrate, a light emitting device, and a first reflection structure. The light emitting device is disposed on the first substrate, wherein a height of the light emitting device is equal to or greater than 1 and less than or equal to 20 µm. The first reflection structure is disposed corresponding to the light emitting device, wherein a light emitted by the light emitting device is reflected by the first reflection structure, and then emitted from the first substrate.

Based on the above, in the display apparatus of the disclosure, a light emission direction of the light emitting device can be controlled by the reflection structure, such that the light emitted by the light emitting device is reflected by the first reflection structure, and then emitted from the first substrate.

To make the aforementioned features and advantages of the disclosure more comprehensible, several embodiments accompanied with figures are described in detail below.

BRIEF DESCRIPTION OF THE DRAWINGS

FIG. 1 to FIG. 28 are schematic partial cross-sectional views of display apparatuses according to a plurality of embodiments of the disclosure.

DESCRIPTION OF THE EMBODIMENTS

The directional terms mentioned in the following embodiments, for example, "on," "under," "left," "right," "front," "back," and so on, merely refer to directions in the accompanying drawings. Therefore, the directional terms are used to illustrate rather than limit the disclosure. For example, in the descriptions below, an expression of "a first object is on a second object" covers embodiments in which the first object directly contacts the second object, and embodiments in which the first object does not directly contact the second object. Besides, in the embodiments in which the first object does not directly contact the second object, there may be other objects or simply a space between the first object and the second object.

Figure 1:
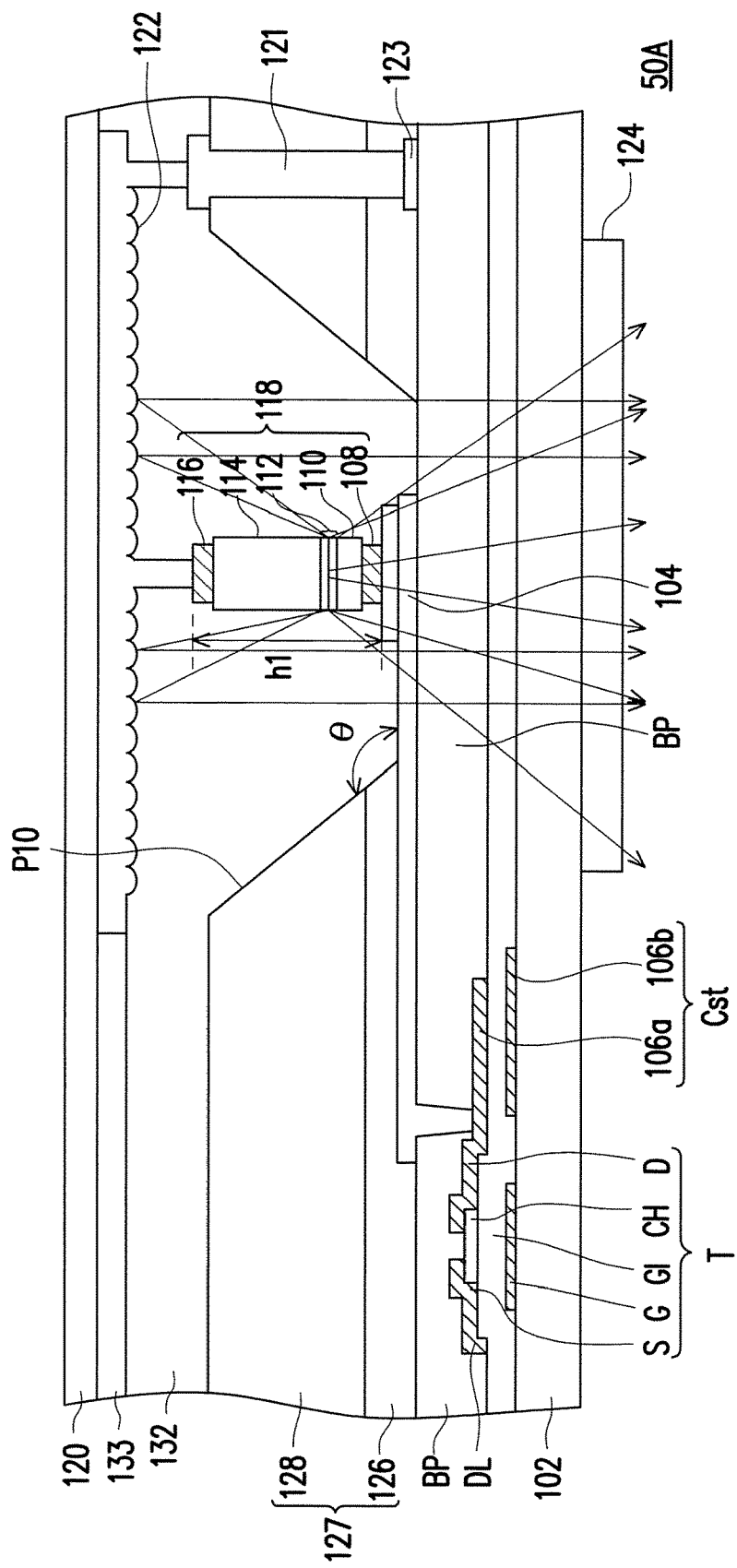

FIG. 1 is a schematic partial cross-sectional view of a display apparatus according to an embodiment of the disclosure. Referring to FIG. 1, a display apparatus 50A in the present embodiment includes a first substrate 102, a light emitting device 118, and a first reflection structure 122. The light emitting device 118 is disposed on the first substrate 102, wherein a height h1 of the light emitting device 118 is equal to or greater than 1 µm and less than or equal to 20 µm. If the height h1 of the light emitting device 118 is less than 1 µm, structural strength of the light emitting device 118 may be weakened and more defects may be generated. If the height h1 of the light emitting device 118 is greater than 20 µm, illumination efficiency or heat dissipation efficiency of the light emitting device 118 may be reduced. In another embodiment, the height h1 of the light emitting device 118 may be equal to or greater than 2 µm and less than or equal to 12 µm, or may be equal to or greater than 5 µm and less than or equal to 10 µm. The first reflection structure 122 is disposed corresponding to the light emitting device 118. In the present embodiment, the light emitting device 118 may be disposed between the first substrate 102 and a second substrate 120, and the first reflection structure 122 is disposed on one side of the second substrate 120 facing the light emitting device 118.

In the display apparatus 50A of the present embodiment, a light emitted by the light emitting device 118 can be reflected by the first reflection structure 122, and then emitted outward from the first substrate 102 (as shown by the arrows in FIG. 1). Furthermore, a final display surface is located on one side of the first substrate 102 in the display apparatus 50A. Therefore, the design of the present embodiment easily changes a light emission direction of the light emitting device 118, such that a display direction of the display apparatus 50A more easily meets different design requirements.

The display apparatus 50A further includes a driving device T. The driving device T may be disposed on the first substrate 102, and the light emitting device 118 is staggered with the driving device T. In this way, there is no need to bond the light emitting device 118 onto the driving device T. Therefore, before bonding the light emitting device 118 to the first substrate 102, it may not be necessary to dispose a planarization layer between the light emitting device 118 and the first substrate 102. Accordingly, when the light emitting device 118 is bonded to the first substrate 102, a problem of softening of the planarization layer between the light emitting device 118 and the first substrate 102 due to heating can be prevented, thus alignment precision of the bonding can be improved.

A special patterning process may be performed on the first reflection structure 122 of the present embodiment, such that the reflected light is emitted toward a more uniform direction, thus a high brightness display effect is more likely to be attained. For example, the first reflection structure 122 is, for instance, a metal layer or an omnidirectional reflective mirror (ODM). The ODM is, for instance, a multilayer structure composed by metal layers and oxide layers. A material of the metal layers may include aluminum and silver, and a material of the oxide layers may include silicon oxide. In one embodiment, the display apparatus 50A may further include a conductive via 121 and an electrode 123. The electrode 123 may be disposed on the first substrate 102, and the conductive via 121 may be electrically connected between the first reflection structure 122 and the electrode 123. The electrode 123 may transmit a common signal, and the common signal may be transmitted to an electrode 116 of the light emitting device 118 through the conductive via 121 and the first reflection structure 122 in sequence. In one embodiment, materials of the conductive via 121 and the electrode 123 may include metal or other conductive materials.

The display apparatus 50A of the present embodiment may further include a wavelength conversion layer 124 disposed on one side of the first substrate 102. In the present embodiment, the wavelength conversion layer 124 is disposed on one side of the first substrate 102 that is away from the light emitting device 118. In other embodiments, the wavelength conversion layer 124 may also be disposed on one side of the first substrate 102 that is adjacent to the light emitting device 118. In one embodiment, an orthogonal projection of the wavelength conversion layer 124 on the first substrate 102 partially overlaps with an orthogonal projection of the light emitting device 118 on the first substrate 102. In other embodiments, the orthogonal projection of the wavelength conversion layer 124 on the first substrate 102 may completely overlap with the orthogonal projection of the light emitting device 118 on the first substrate 102. The orthogonal projection refers to a set of projection points of mutually parallel projection lines passing through various points on a projection object (for example, the wavelength conversion layer 124 herein) on a projection plane (for example, a surface of the first substrate 102 herein), and the aforementioned mutually parallel projection lines are perpendicular to the projection plane. In this way, the light provided by the light emitting device 118 passes through the wavelength conversion layer 124 before being emitted outward. The wavelength conversion layer 124 may be applied to change a wavelength of the light emitted from the light emitting device 118. For example, the light emitting device 118 may provide an invisible light, and the wavelength conversion layer 124 converts the invisible light to a light with desired color such as red light, blue light, green light, or so forth. In addition, the light emitting device 118 may also provide a visible light, and the wavelength conversion layer 124 converts the visible light to a light with desired color such as red light, blue light, green light, or so forth. In the present embodiment, the wavelength conversion layer 124 may be a quantum dot layer. In other embodiments, the wavelength conversion layer 124 may also be a quantum dot layer, a phosphor powder layer, a fluorescent powder layer or a combination thereof.

In other embodiments, the aforementioned wavelength conversion layer 124 may be replaced with a color filter layer. In other words, either the wavelength conversion layer or the color filter layer may be disposed on one side of the first substrate 102.

The light emitting device 118 of the present embodiment is a vertical LED for exemplary purposes. However, in other embodiments, a flip-chip LED or other light emitting devices may also be adopted as the light emitting device 118. The light emitting device 118 may be a micron-sized LED. In one embodiment, a length and a width of the light emitting device 118 are respectively less than or equal to 300 µm, and equal to or greater than 1 µm. In other embodiments, the length and the width of the light emitting device 118 may further be respectively less than or equal to 100 µm and greater than or equal to 2 µm, less than or equal to 20 µm and greater than or equal to 3 µm, or less than or equal to 10 µm and greater than or equal to 5 µm.

A first insulating layer 127 may be disposed on the first substrate 102 of the present embodiment. In the present embodiment, the first insulating layer 127 may be a multilayer structure, which includes an insulating layer 126 and an insulating layer 128 sequentially disposed on the first substrate 102. The insulating layer 126 and the insulating layer 128 have an opening P10, and the light emitting device 118 is disposed at the opening P10. In other embodiments, the first insulating layer 127 may also be a single-layer structure. The first insulating layer 127 has the opening P10, and the light emitting device 118 is disposed at the opening P10. At least one of the insulating layer 126 and the insulating layer 128 may be formed of a light shielding material, and may be used as (but not limited to) a black matrix (BM). Therefore, if a plurality of light emitting devices are disposed in the display apparatus 50A, the light emitted from adjacent light emitting devices can be blocked, and the adjacent light emitting devices are prevented from interfering with each other, so as to improve display quality. Additionally, the insulating layer 126 or the insulating layer 128 formed of the light shielding material may further cover the driving device T to prevent the driving device T from reflecting external light, which may be observed by users and the display quality may be affected. Furthermore, the insulating layer 126 may further protect the driving device T. An angle $\theta$ between a side wall of the opening P10 of the insulating layer 126 and the insulating layer 128 and the first substrate 102 is, for instance, less than or equal to 150° and greater than or equal to 60°. In another embodiment, the angle $\theta$ between the side wall of the opening P10 and the first substrate 102 is, for instance, less than or equal to 135° and greater than or equal to 90°. The first reflection structure 122, for instance, roughly covers one side of the opening P10 that is close to the second substrate 120. The wavelength conversion layer 124 may be disposed at one side of the first substrate 102 that is opposite to the light emitting device 118, and may roughly cover the opening P10. A second insulating layer 132 may further be disposed on the first substrate 102. The second insulating layer 132 fills the opening P10 and covers the light emitting device 118 and the insulating layer 128. In one embodiment, the second insulating layer 132 may be a planarization layer. In addition, the first reflection structure 122, for instance, is formed on the second insulating layer 132. In the present embodiment, a third insulating layer 133 may further be disposed between the second substrate 120 and the second insulating layer 132. The third insulating layer 133 may be located on the same side as the first reflection structure 122, such that adjacent first reflection structures 122 may be separated from each other. In one embodiment, the third insulating layer 133 may be formed of a light shielding material, so as to be used as (but not limited to) a BM, in order to prevent the adjacent light emitting devices from interfering with each other.

The driving device T includes, for instance, a gate G, a gate insulating layer GI, a channel layer CH, a source S, and a drain D. A material of the channel layer CH, for instance (but not limited to), includes amorphous silicon or an oxide semiconductor material. The oxide semiconductor material includes, for instance (but not limited to), indium-gallium-zinc oxide (IGZO), zinc oxide, tin oxide (SnO), indium-zinc oxide, gallium-zinc oxide (GZO), zinc-tin oxide (ZTO), indium-tin oxide, or so forth. That is, in the present embodiment, the driving device T is, for instance, an amorphous silicon thin film transistor or an oxide semiconductor thin film transistor. However, the disclosure is not limited thereto. In other embodiments, the driving device T may also be a low temperature polysilicon thin film transistor, a silicon-based thin film transistor, or a microcrystalline silicon thin film transistor. Besides, in the present embodiment, the driving device T is a bottom gate transistor. However, the disclosure is not limited thereto. In other embodiments, the driving device T may also be a top gate transistor.

Additionally, the gate insulating layer GI is disposed between the gate G and the channel layer CH. The gate insulating layer GI is conformally formed on the first substrate 102, and covers the gate G. A material of the gate insulating layer GI includes, for instance (but not limited to), an inorganic material, an organic material or a combination thereof. The inorganic material is, for instance (but not limited to), silicon oxide, silicon nitride, silicon oxynitride, or a stacked layer of at least two of the aforementioned materials. The organic material is, for instance (but not limited to), a polymer material such as a polyimide-based resin, an epoxy-based resin, or an acrylic resin, and so on. Moreover, the source S and the drain D are located on the channel layer CH, and the source S is electrically connected to a data line DL. In addition, in the present embodiment, a fourth insulating layer BP may further cover the driving device T to protect the driving device T. The fourth insulating layer BP is conformally formed on the first substrate 102, and a material of the fourth insulating layer BP is, for instance (but not limited to), an inorganic material, an organic material or a combination thereof. The inorganic material is, for instance (but not limited to), silicon oxide, silicon nitride, silicon oxynitride, or a stacked layer of at least two of the aforementioned materials. The organic material is, for instance (but not limited to), a polymer material such as a polyimide-based resin, an epoxy-based resin, or an acrylic resin, and so on. In the present embodiment, the display apparatus 50A may further include a circuit storage capacitor Cst, which includes an upper electrode 106a and a lower electrode 106b. The upper electrode 106a is, for instance, connected to the drain D, and the lower electrode 106b is, for instance, a common electrode.

The light emitting device 118 of the present embodiment may include an electrode 108, a P-type semiconductor layer 110, a multiple quantum well structure 112, an N-type semiconductor layer 114, and an electrode 116. The electrode 108 may be disposed on the fourth insulating layer BP and may be staggered with the driving device T. The P-type semiconductor layer 110, the multiple quantum well structure 112 and the N-type semiconductor layer 114 are located between the electrode 108 and the electrode 116, and the multiple quantum well structure 112 is located between the N-type semiconductor layer 114 and the P-type semiconductor layer 110. In the present embodiment, a height h of the light emitting device 118 represents a distance from a bottom surface of the electrode 108 to a top surface of the electrode 116. In addition, the display apparatus 50A may further include a transparent conductive structure 104, which is disposed between the fourth insulating layer BP and the light emitting device 118, and is electrically connected to the electrode 108 of the light emitting device 118 and the drain D of the driving device T. In one embodiment, the transparent conductive structure 104 may be a multilayer structure. Furthermore, the electrode 116 may be electrically connected to the first reflection structure 122, such that the common signal is transmitted to the electrode 116 through the electrode 123, the conductive via 121 and the first reflection structure 122 in sequence. In one embodiment, the electrode 123 may be located on the fourth insulating layer BP. In other embodiments, the electrode 123 may be located on the same layer as at least one of the gate G, the source S, and the drain D of the driving device T, and the upper electrode 106a or the lower electrode 106b, which means they may be composed of the same material layer formed by the same patterning process.

Figure 2:
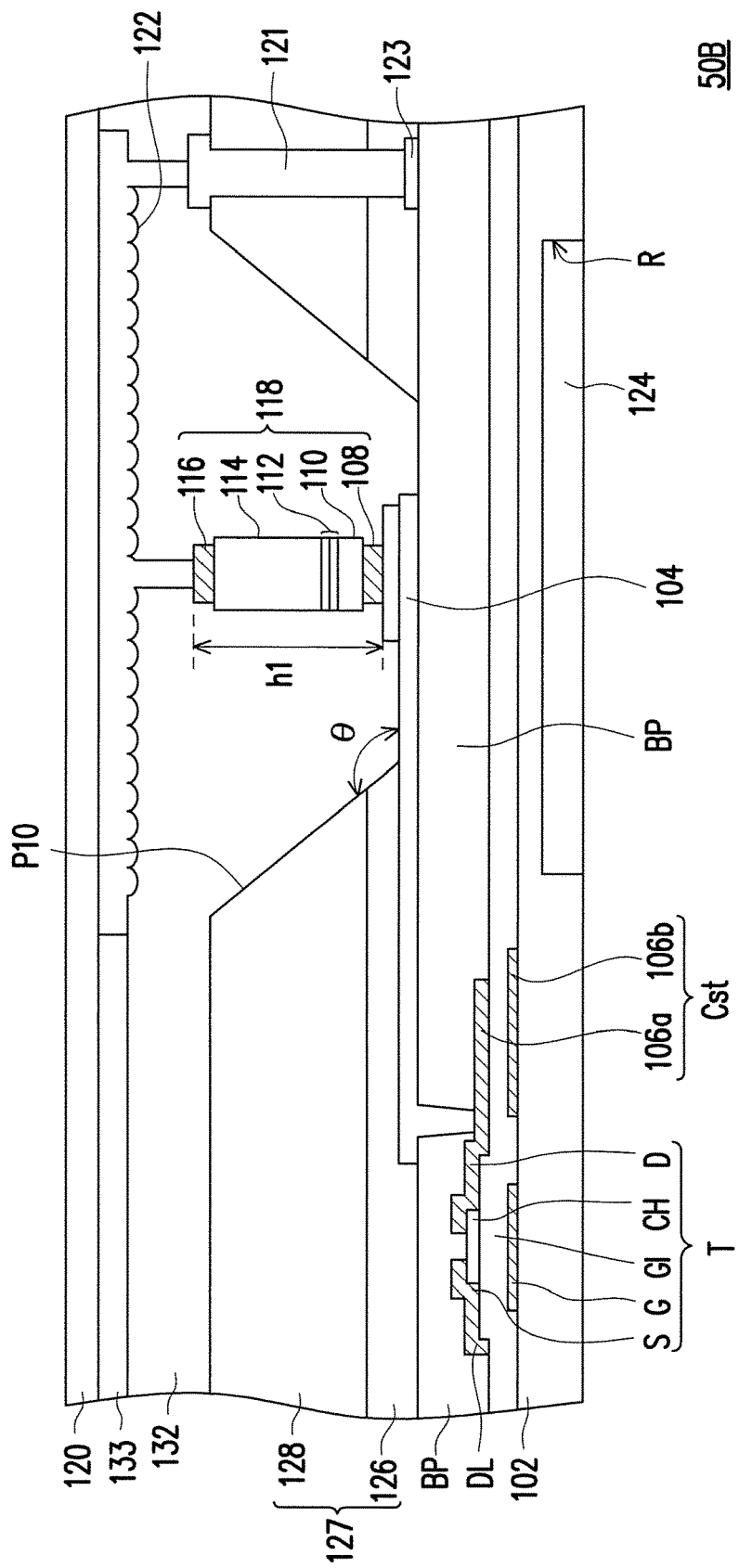

Referring to FIG. 1 and FIG. 2 together, a display apparatus 50B shown in FIG. 2 is similar to the display apparatus 50A in FIG. 1. The first substrate 102 in FIG. 2 has a recess R, and the wavelength conversion layer 124 is disposed in the recess R to form an embedded wavelength conversion layer. In the present embodiment, the wavelength conversion layer 124 may be formed to be aligned with a bottom surface of the first substrate 102 (as shown in FIG. 2). In other embodiments, the wavelength conversion layer 124 may not be aligned with the bottom surface of the first substrate 102. That is, the wavelength conversion layer 124 may be formed protruding from or recessed in the bottom surface of the first substrate 102.

Figure 3:
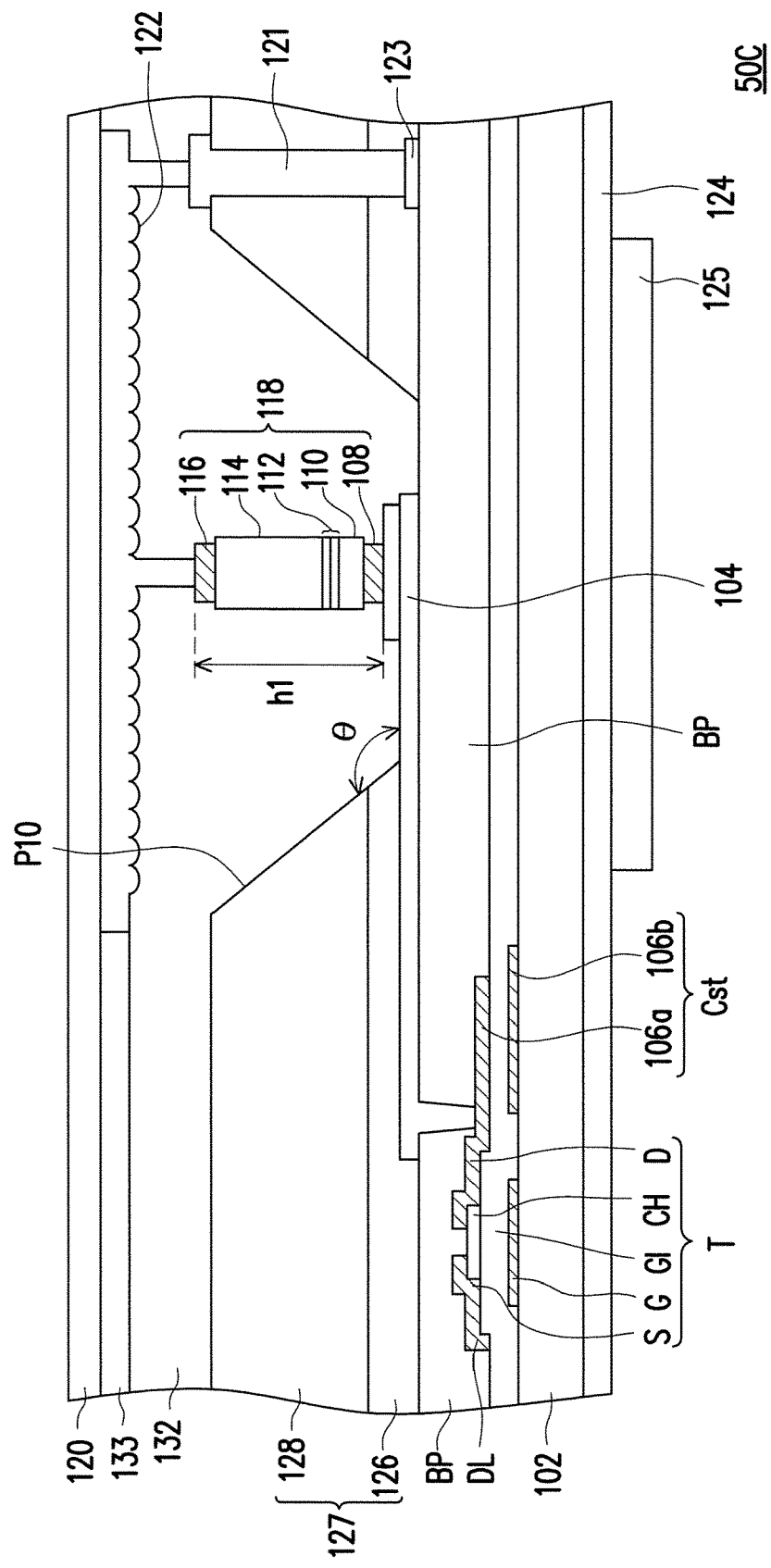

Referring to FIG. 1 and FIG. 3 together, a display apparatus 50C shown in FIG. 3 is similar to the display apparatus 50A in FIG. 1. The display apparatus 50C in FIG. 3 further includes a color filter layer 125. The wavelength conversion layer 124 is disposed between the first substrate 102 and the color filter layer 125. In addition, an orthogonal projection of the color filter layer 125 on the first substrate 102 at least partially overlaps with the orthogonal projection of the light emitting device 118 on the first substrate 102. In the present embodiment, the wavelength conversion layer 124 is, for instance (but not limited to), a phosphor powder layer.

Figure 4:
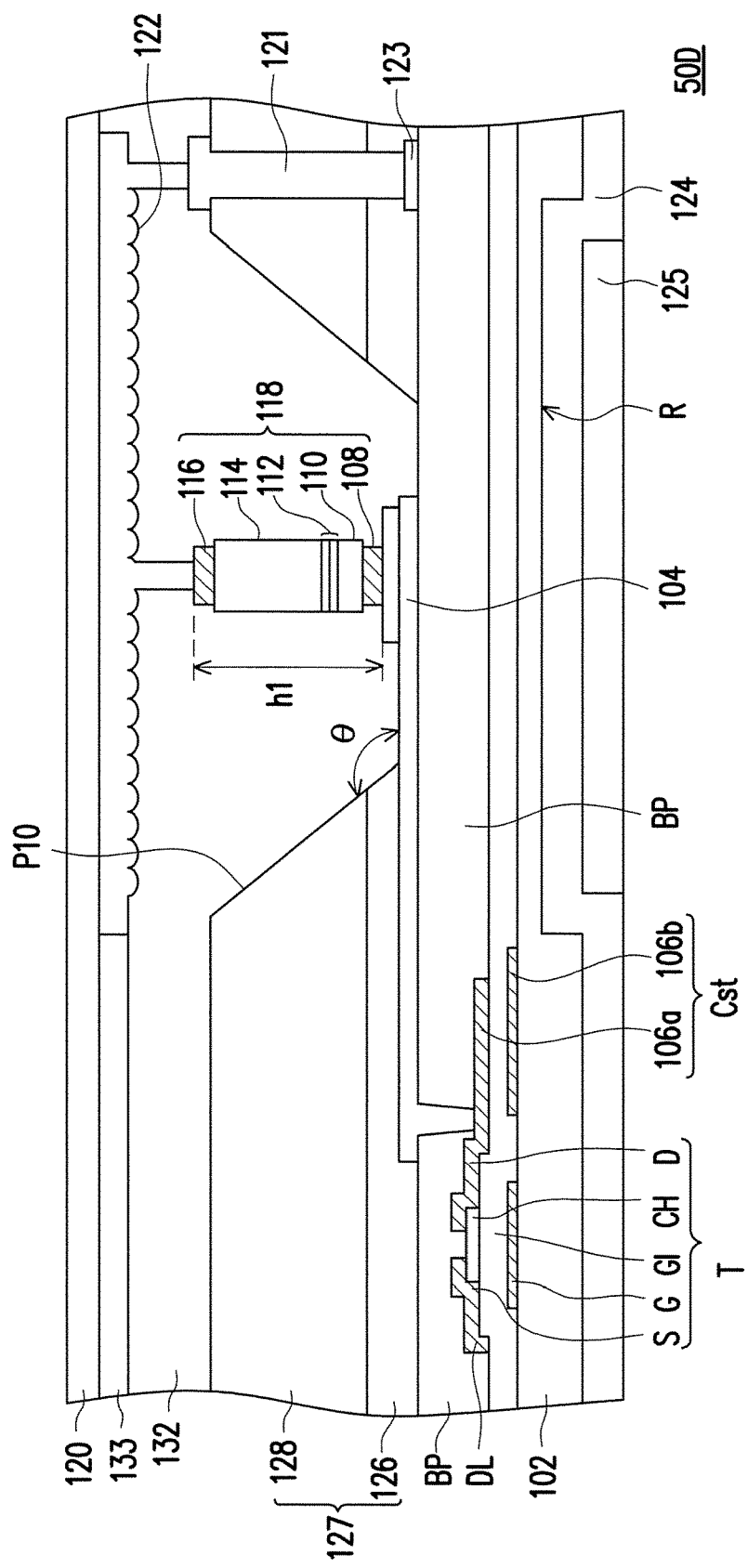

Referring to FIG. 2 and FIG. 4 together, a display apparatus 50D in FIG. 4 is similar to the display apparatus 50B in FIG. 2. The display apparatus 50D in FIG. 4 further includes the color filter layer 125. The wavelength conversion layer 124 is disposed between the first substrate 102 and the color filter layer 125. In addition, the orthogonal projection of the color filter layer 125 on the first substrate 102 at least partially overlaps with the orthogonal projection of the light emitting device 118 on the first substrate 102. In the present embodiment, the wavelength conversion layer 124 is, for instance (but not limited to), a phosphor powder layer.

FIG. 5 to FIG. 8 are schematic partial cross-sectional views of display apparatuses according to several embodiments of the disclosure.

Figure 5:
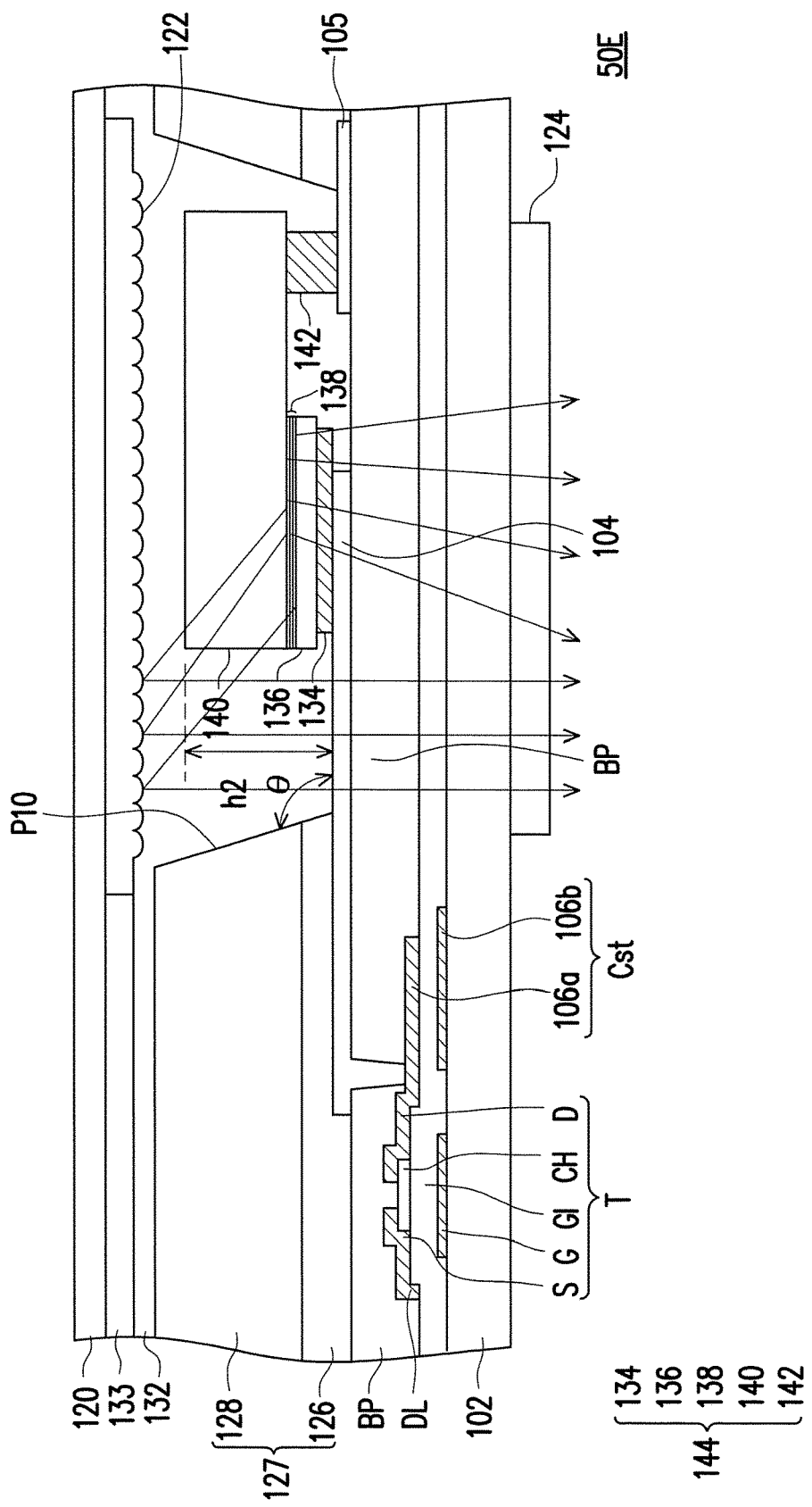

Referring to FIG. 1 and FIG. 5 together, a display apparatus 50E in FIG. 5 is similar to the display apparatus 50A in FIG. 1. A light emitting device 144 in FIG. 5 is a flip-chip LED. In the present embodiment, the light emitting device 144 includes an electrode 134, a P-type semiconductor layer 136, a multiple quantum well structure 138, an N-type semiconductor layer 140 and an electrode 142. The electrode 134 and the electrode 142 may be disposed on the fourth insulating layer BP, and may be staggered with the driving device T. The N-type semiconductor layer 140 is disposed on the electrode 132 and the electrode 142. The P-type semiconductor layer 136 is disposed between the N-type semiconductor layer 140 and the electrode 134. In addition, the transparent conductive structure 104 is electrically connected to the electrode 134 and the drain D. The display apparatus 50E further includes a transparent conductive structure 105, which is electrically connected to the electrode 142. In the present embodiment, a height h2 represents a distance from a bottom surface of the electrode 134 or the electrode 142 to a top surface of the N-type semiconductor layer 140. A light emitted by the light emitting device 144 can be reflected by the first reflection structure 122 and then emitted outward from the first substrate 102 (as shown by the arrows in FIG. 5).

Figure 6:
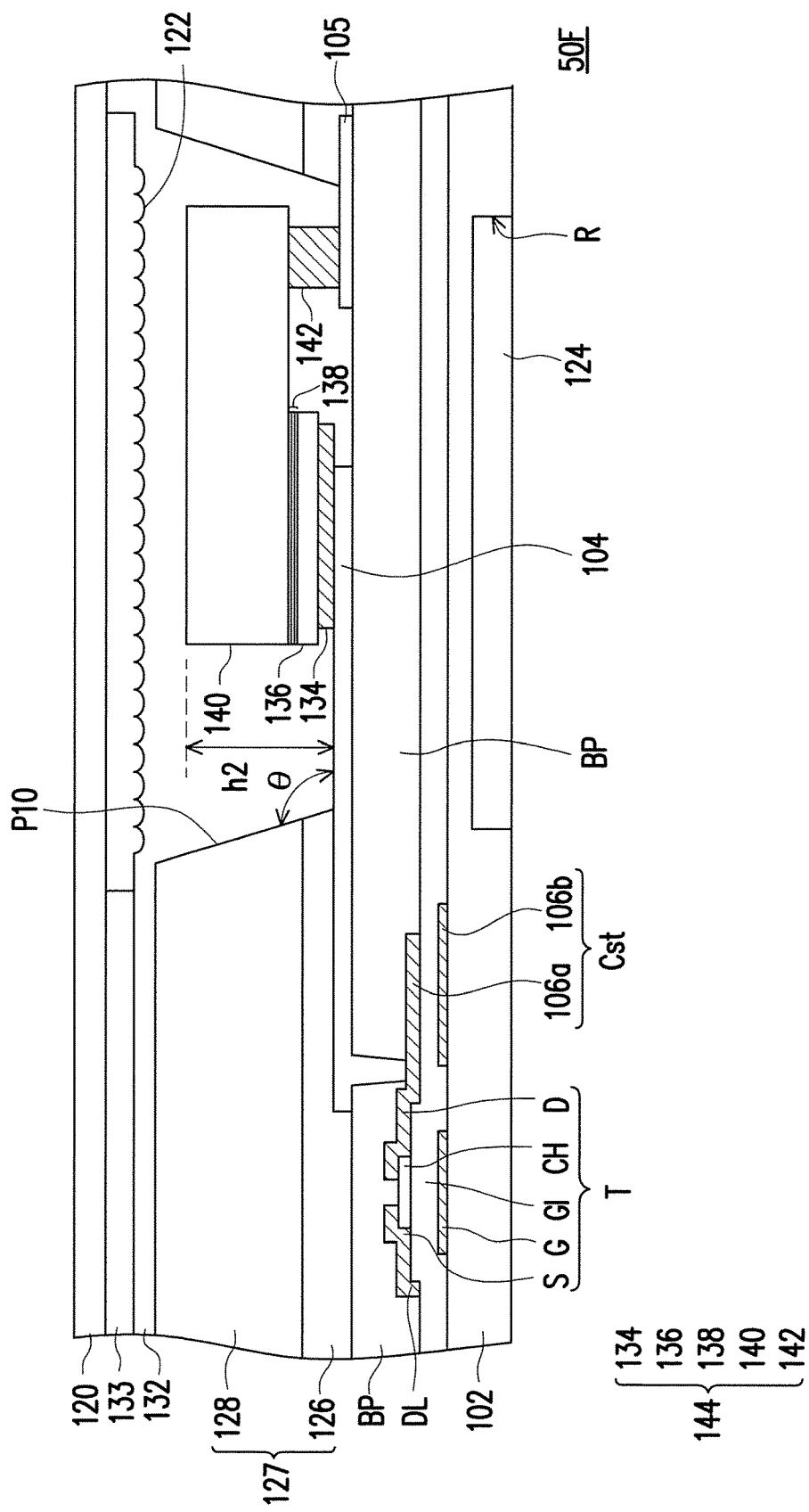

Referring to FIG. 5 and FIG. 6 together, a display apparatus 50F shown in FIG. 6 is similar to the display apparatus 50E in FIG. 5. The first substrate 102 in FIG. 6 has the recess R, and the wavelength conversion layer 124 is disposed in the recess R to form an embedded wavelength conversion layer. In the present embodiment, the wavelength conversion layer 124 is formed to be aligned with the bottom surface of the first substrate 102 (as shown in FIG. 6). In other embodiments, the wavelength conversion layer 124 may not be aligned with the bottom surface of the first substrate 102. That is, the wavelength conversion layer 124 may be formed protruding from or recessed in the bottom surface of the first substrate 102.

Figure 7:
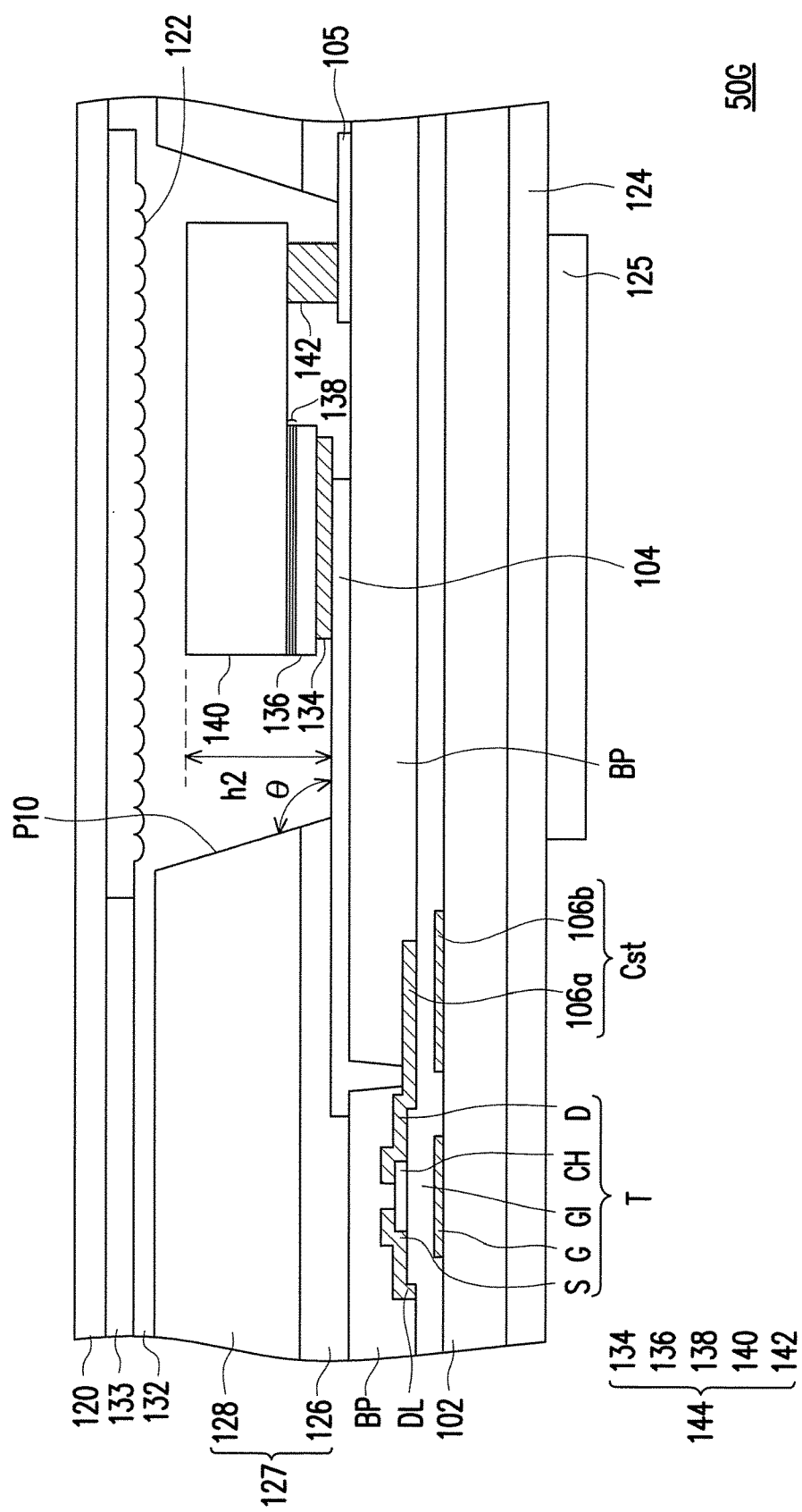

Referring to FIG. 5 and FIG. 7 together, a display apparatus 50G shown in FIG. 7 is similar to the display apparatus 50E in FIG. 5. The display apparatus 50G in FIG. 7 further includes the color filter layer 125. The wavelength conversion layer 124 is disposed between the first substrate 102 and the color filter layer 125. In addition, the orthogonal projection of the color filter layer 125 on the first substrate 102 at least partially overlaps with the orthogonal projection of the light emitting device 144 on the first substrate 102. In the present embodiment, the wavelength conversion layer 124 may be a phosphor powder layer, but the disclosure is not limited thereto.

Figure 8:
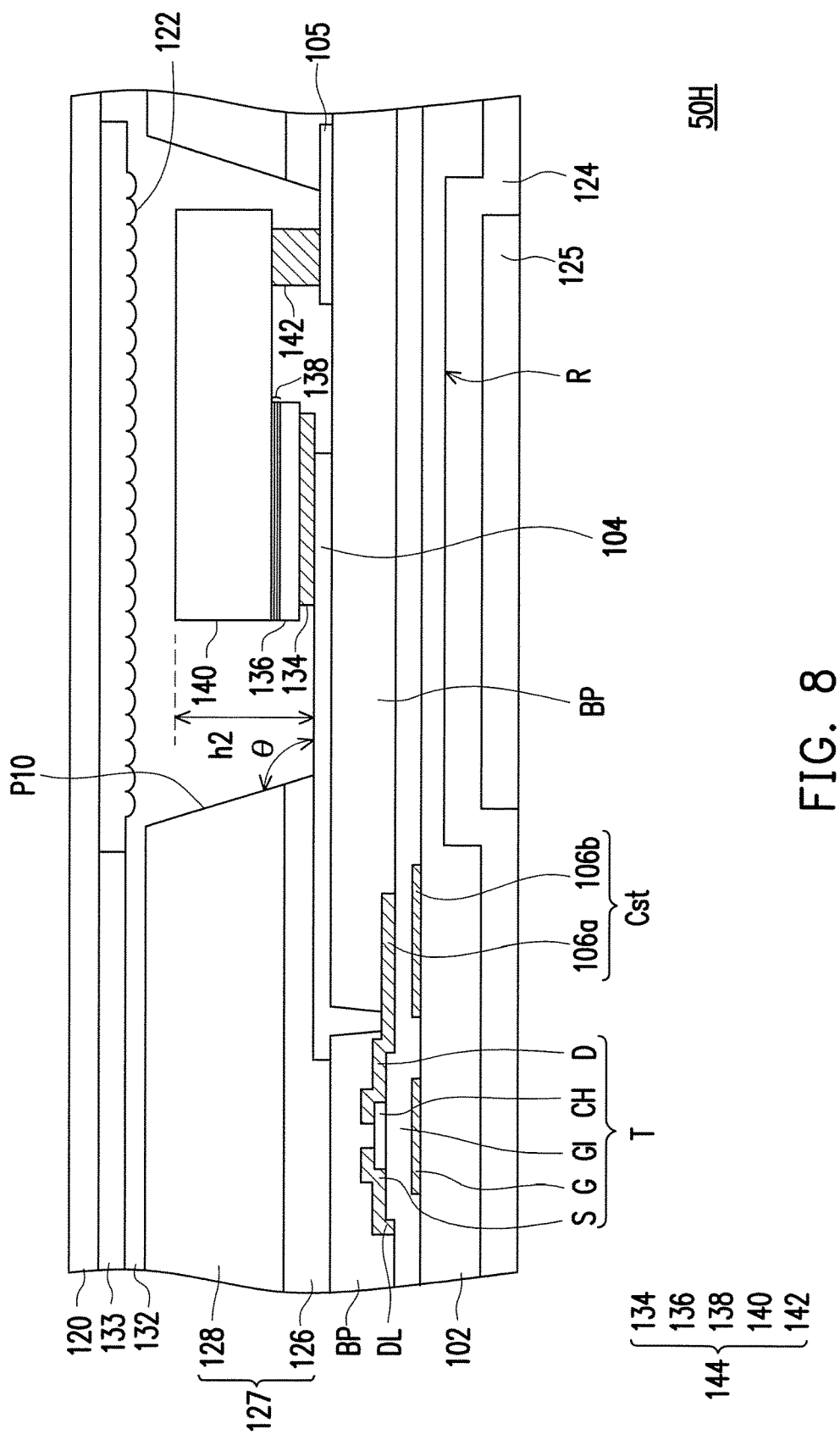

Referring to FIG. 8 and FIG. 6 together, a display apparatus 50H shown in FIG. 8 is similar to the display apparatus 50F in FIG. 6. The display apparatus 50H in FIG. 8 further includes the color filter layer 125. The wavelength conversion layer 124 is disposed between the first substrate 102 and the color filter layer 125. Besides, the orthogonal projection of the color filter layer 125 on the first substrate 102 at least partially overlaps with the orthogonal projection of the light emitting device 144 on the first substrate 102. In the present embodiment, the wavelength conversion layer 124 may be a phosphor powder layer, but the closure is not limited thereto.

Figure 9:
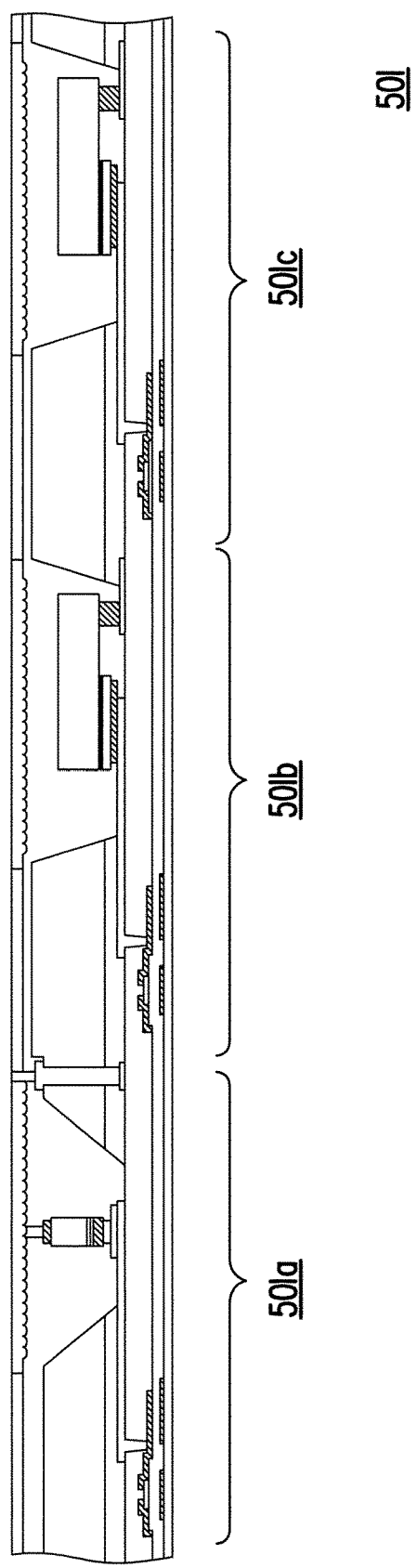

FIG. 9 is a schematic partial cross-sectional view of a display apparatus according to an embodiment of the disclosure. Referring to FIG. 1, FIG. 5, and FIG. 9 together, a display apparatus 50I in FIG. 9 has a plurality of sub-pixel areas including a sub-pixel area 50Ia, a sub-pixel area 50Ib, and a sub-pixel area 50Ic. The sub-pixel area 50Ia is similar to the display apparatus 50A shown in FIG. 1. The sub-pixel area 50Ib and the sub-pixel area 50Ic are similar to the display apparatus 50E shown in FIG. 5. Since a plurality of light emitting devices of the display apparatus 50I in FIG. 9 may respectively emit light in different wavelength ranges, the display apparatus 50I in FIG. 9 may not include a wavelength conversion layer. In terms of structure, the plurality of light emitting devices may be vertical LEDs, flip-chip LEDs or a combination thereof. However, the disclosure is not limited to the types of a plurality of light emitting devices, and may be altered by persons having ordinary skill in the art according to their needs.

FIG. 10 to FIG. 17 are schematic partial cross-sectional views of display apparatuses according to several embodiments of the disclosure.

Figure 10:
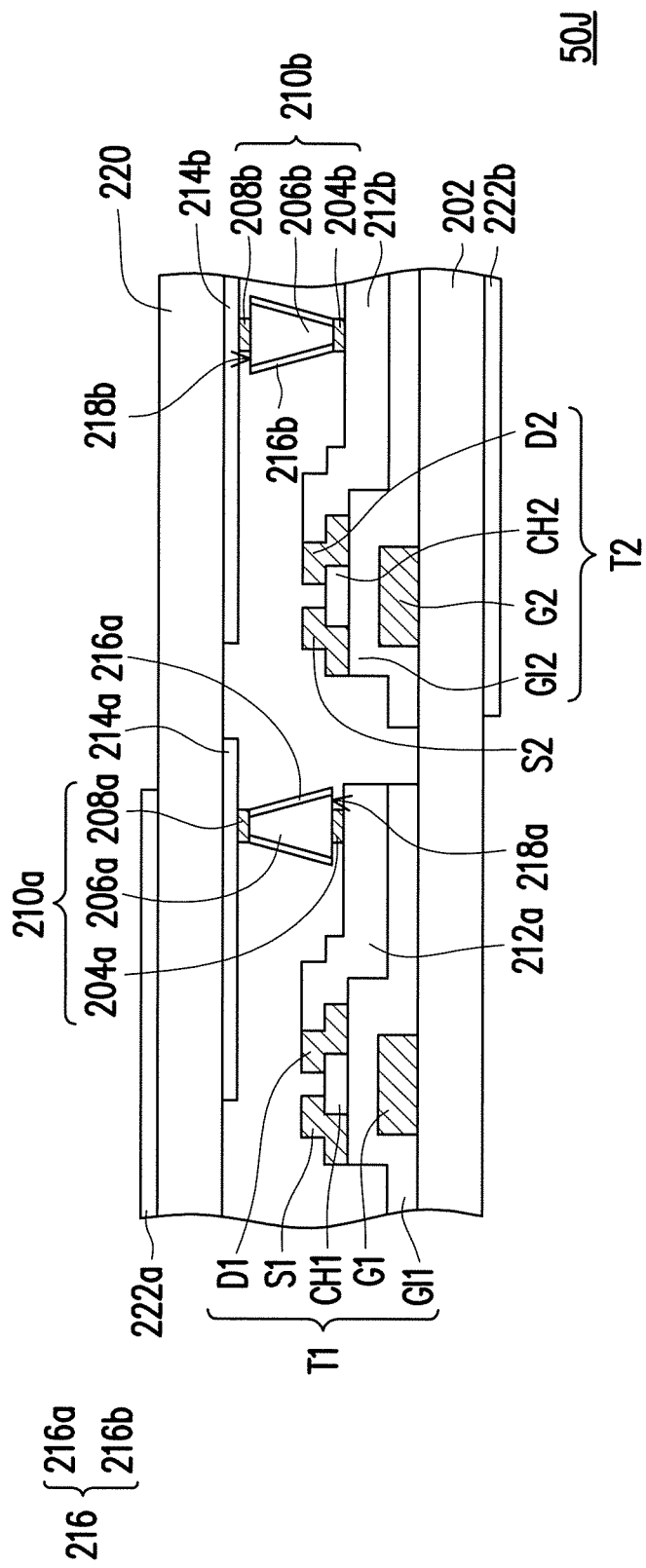

Referring to FIG. 1 and FIG. 10, a display apparatus 50J in FIG. 10 is similar to the display apparatus 50A in FIG. 1. The display apparatus 50J in FIG. 10 may include a plurality of light emitting devices, and a part of the light emitting devices emit light toward a first substrate 202, and the other part of the light emitting devices emit light toward a second substrate 220, so as to form a double-sided light emitting display apparatus. In one embodiment, the display apparatus 50J may further include the first insulating layer 127 and the second insulating layer 132 as shown in FIG. 1, which are omitted from illustration in FIG. 10.

The display apparatus 50J in FIG. 10 includes the first substrate 202, a light emitting device 210a, a light emitting device 210b, a first reflection structure 216, and the second substrate 220. The first substrate 202 has a driving device T1 and a driving device T2, and the light emitting device 210a and the light emitting device 210b are disposed between the first substrate 202 and the second substrate 220.

The first substrate 202 may be a transparent material layer, such as glass. The driving device T1 may be a transistor, which includes a gate G1, a gate insulating layer GI1, a channel layer CH1, a source S1, and a drain D1. Likewise, the driving device T2 is a transistor, which includes a gate G2, a gate insulating layer GI2, a channel layer CH2, a source S2, and a drain D2. The gate GI and the gate G2 may be disposed on the first substrate 202. The gate insulating layer GI1 and the gate insulating layer GI2 may be located on the first substrate 202, and may be located between the gate G1 and the channel layer CH1 and between the gate G2 and the channel layer CH2.

The light emitting device 210a and the light emitting device 210b are separately disposed on the first substrate 202, and are respectively staggered with the driving device T1 and the driving device T2. In terms of structure, the light emitting device 210a and the light emitting device 210b of the present embodiment may be vertical-LEDs.

The light emitting device 210a includes an electrode 204a, a light emitting structure 206a and an electrode 208a. The electrode 204a may be electrically connected to the driving device T1. The light emitting structure 206a is located between the electrode 204a and the electrode 208a, and may include the P-type semiconductor layer, the multiple quantum well structure and the N-type semiconductor layer as shown in FIG. 1, which are omitted from illustration herein. The display apparatus 50J may further include a transparent conductive structure 212a, which is disposed between the electrode 204a and the driving device T1, and extending to electrically connect the electrode 204a and the drain D1. Besides, the display apparatus 50J may also include a transparent conductive structure 214a, which is disposed at the second substrate 220 and electrically connected to the electrode 208a.

Likewise, the light emitting device 210b may include an electrode 204b, a light emitting structure 206b, and an electrode 208b. The electrode 204b may be electrically connected to the driving device T2, and is staggered with the driving device T2. The light emitting structure 206b is located between the electrode 204b and the electrode 208b, and may also include the P-type semiconductor layer, the multiple quantum well structure and the N-type semiconductor layer as shown in FIG. 1, which are omitted from illustration herein. The display apparatus 50J may further include a transparent conductive structure 212b, which is disposed between the electrode 204b and the driving device T2 and extending to electrically connect the electrode 204b and the drain D2. In addition, the display apparatus 50J may also include a transparent conductive structure 214b, which is disposed at the second substrate 220 and electrically connected to electrode 208b.

The first reflection structure 216 includes a first reflection structure 216a and a first reflection structure 216b. The first reflection structure 216a may cover the light emitting device 210a, while exposing a light emitting surface 218a of the light emitting device 210a facing the first substrate 202. Another first reflection structure 216b may cover the light emitting device 210b, while exposing a light emitting surface 218b of the light emitting device 210b facing the light second substrate 220. In the present embodiment, the first reflection structure 216a and the first reflection structure 216b may be metal layers. By disposing the first reflection structure 216a and the first reflection structure 216b, the light emitted by the light emitting device 210a and the light emitting device 210b may be guided to be emitted toward the first substrate 202 and the second substrate 220.

The display apparatus 50J may further include a light shielding layer 222a, which is disposed on one side of the second substrate 220, for instance, above the second substrate 220. Moreover, an orthogonal projection of the light shielding layer 222a on the first substrate 202 overlaps with an orthogonal projection of the light emitting device 210a on the first substrate 202. The light shielding layer 222a is, for instance, a BM or a reflective material. Accordingly, the light shielding layer 222a may prevent the light emitted by the light emitting device 210a from being emitted from the second substrate 220. Likewise, the display apparatus 50J may further include a light shielding layer 222b, which is disposed on one side of the first substrate 202, for instance, the side of the first substrate 202 that is away from the light emitting device 210b. An orthogonal projection of the light shielding layer 222b on the first substrate 202 overlaps with an orthogonal projection of the light emitting device 210b on the first substrate 202. Therefore, by disposing the light shielding layer 222a and the light shielding layer 222b, the light emitting device 210a and the light emitting device 210b which are adjacent to each other may be prevented from interfering each other.

Figure 11:
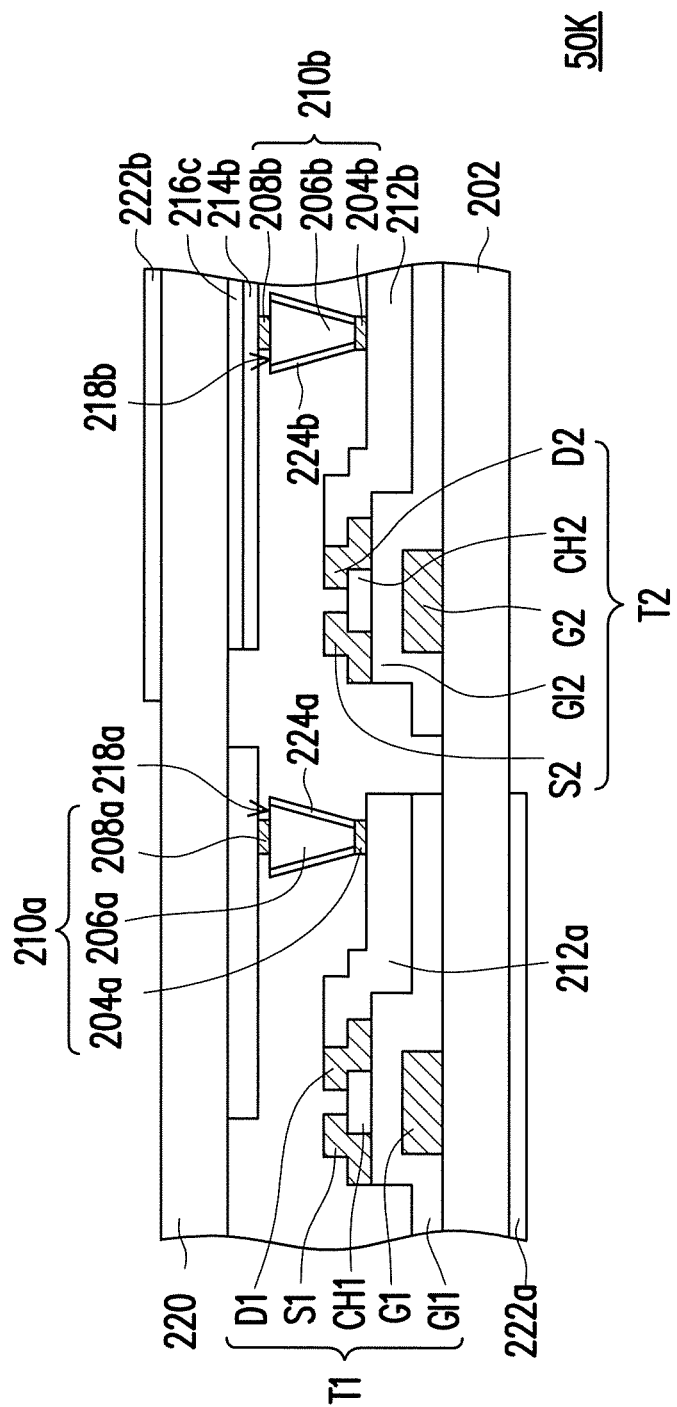

Referring to FIG. 10 and FIG. 11 together, a major difference between the display apparatus 50J in FIG. 10 and a display apparatus 50K in FIG. 11 is that the light emission directions of the light emitting devices are different. Nevertheless, both the display apparatus 50J and the display apparatus 50K are double-sided light emitting display apparatuses.

To be more specific, a first reflection structure 216c of the display apparatus 50K may be disposed at the second substrate 220. An orthogonal projection of the first reflection structure 216c on the first substrate 202 overlaps with the orthogonal projection of the light emitting device 210b on the first substrate 202. Particularly, the first reflection structure 216c may be located between the second substrate 220 and the transparent conductive structure 214b. The display apparatus 50K includes a second reflection structure 224a and a second reflection structure 224b. The second reflection structure 224a covers the light emitting device 210a, while exposing the light emitting surface 218a of the light emitting device 210a facing the second substrate 220. The second reflection structure 224b covers the light emitting device 210b, while exposing the light emitting surface 218b of the light emitting device 210b facing the second substrate 220. In the present embodiment, the light emission directions of the light emitting device 210a and the light emitting device 210b are both toward the second substrate 220, and the light emitted by the light emitting device 210b is reflected by the first reflection structure 216c, and then emitted from the first substrate 202. In this way, the display apparatus 50K may also be a double-sided light emitting display apparatus.

Besides, the light shielding layer 222a is disposed on one side of the first substrate 202, for instance, the side of the first substrate 202 that is away from the light emitting device 210a. The orthogonal projection of the light shielding layer 222a on the first substrate 202 overlaps with the orthogonal projection of the light emitting device 210a on the first substrate 202, so as to block the light emitted from the emitting device 210a toward the first substrate 202. The light shielding layer 222b is disposed on one side of the second substrate 220, for instance, above the second substrate 220. The orthogonal projection of the light shielding layer 222b on the first substrate 202 overlaps with the orthogonal projection of the light emitting device 210b on the first substrate 202, so as to block the light emitted by light emitting device 210b toward the second substrate 220. By disposing the light shielding layer 222a and the light shielding layer 222b, the light emitting device 210a and the light emitting device 210b may be prevented from interfering each other.

Accordingly, a part of the light emitted by the display apparatus 50K is emitted toward the second substrate 220, and the other part of the light emitted is emitted toward the first substrate 202. Therefore, the display apparatus 50K may also perform double-side light emission.

Figure 12:
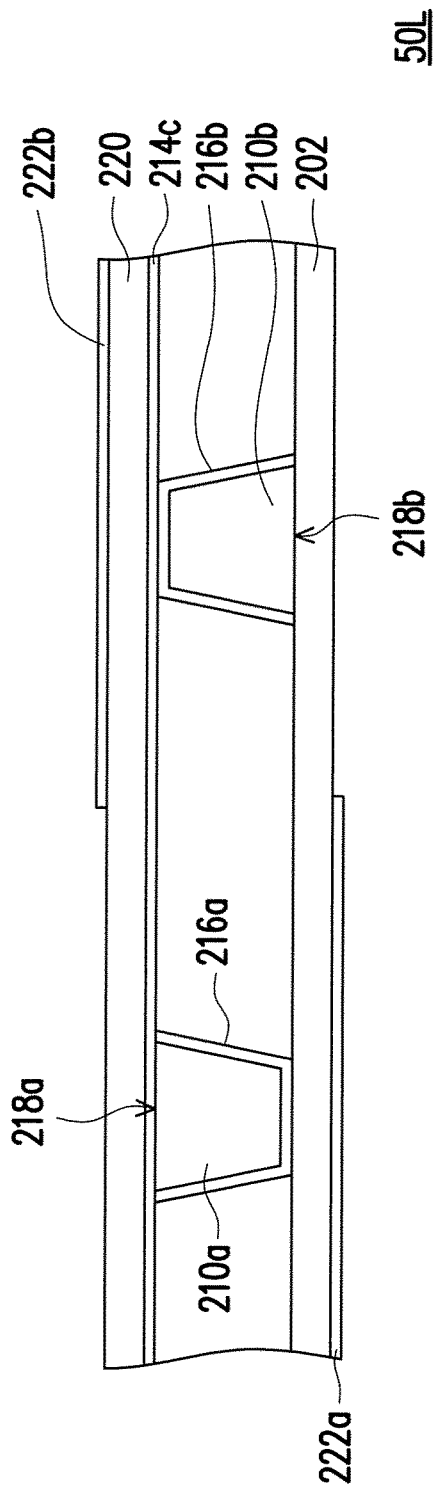

Referring to FIG. 10 and FIG. 12 together, a display apparatus 50L shown in FIG. 12 is similar to the display apparatus 50J in FIG. 10, and both of them are double-sided light emitting display apparatuses. The first reflection structure 216a in FIG. 12 covers the light emitting device 210a, while exposing the light emitting surface 218a of the light emitting device 210a facing the second substrate 220. In addition, the first reflection structure 216b covers the light emitting device 210b, while exposing the light emitting surface 218b of the light emitting device 210b facing the first substrate 202. For simplicity, the driving device T1, the driving device T2, the transparent conductive structure 212a, and the transparent conductive structure 212b as shown in FIG. 10 are omitted in FIG. 12. Besides, the light emitting device 210a and the light emitting device 210b in FIG. 12 share a transparent conductive structure 214c. In other words, the transparent conductive structure 214c is electrically connected to both of the light emitting device 210a and the light emitting device 210b.

The light shielding layer 222a of the display apparatus 50L is disposed on one side of the first substrate 202, for instance, the side of the first substrate 202 that is away from the light emitting device 210a. The orthogonal projection of the light shielding layer 222a on the first substrate 202 overlaps with the orthogonal projection of the light emitting device 210a on the first substrate 202. On the other hand, the light shielding layer 222b of the display apparatus 50L is disposed on one side of the second substrate 220, for instance, above the second substrate 220. The orthogonal projection of the light shielding layer 222b on the first substrate 202 overlaps with the orthogonal projection of the light emitting device 210b on the first substrate 202.

Figure 13:
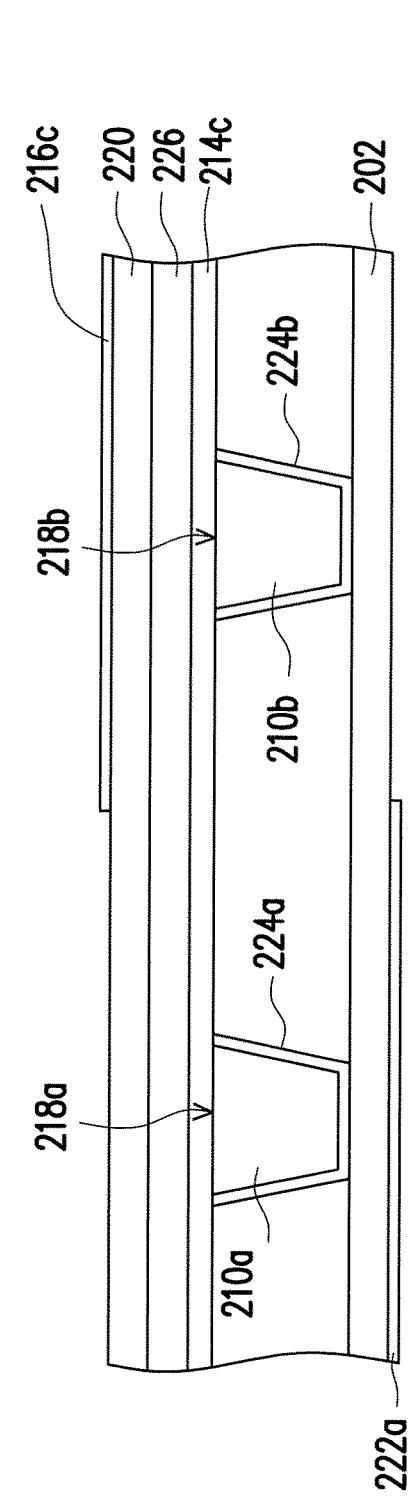

Referring to FIG. 11 and FIG. 13 together, a display apparatus 50M shown in FIG. 13 is similar to the display apparatus 50K in FIG. 11. A major difference between the above two is in the position of the first reflection structure 216c. In addition, the display apparatus 50M in FIG. 13 further includes a wavelength conversion layer 226.

In the present embodiment, the second substrate 220 may be a color filter layer. The second substrate 220 may be located between the first reflection structure 216c and the light emitting device 210b. In addition, if a transmittance of the first reflection structure 216c is rather low, such as lower than 5%, a light shielding layer may not be disposed at an exterior side of the second substrate 220 and the first reflection structure 216c.

The wavelength conversion layer 226 may be located between the transparent conductive structure 214c and the second substrate 220. Accordingly, the wavelength range of light emitted by the light emitting device 210a and the light emitting device 210b can be altered.

In addition, the driving device T1, the driving device T2, the transparent conductive structure 212a, and the transparent conductive structure 212b as shown in FIG. 11 are omitted in FIG. 13. Besides, the transparent conductive structure 214c in FIG. 13 may be electrically connected to both of the light emitting device 210a and the light emitting device 210b.

Referring to FIG. 13 and FIG. 14 together, a display apparatus 50N shown in FIG. 14 is similar to the display apparatus 50M in FIG. 13. A major difference between the above two is that the second substrate 220 in FIG. 14 may be a transparent substrate, which has a transparent conductive structure electrically connected to both of the light emitting device 210a and the light emitting device 210b. Besides, a wavelength conversion layer 226a and a wavelength conversion layer 226b may be separately disposed on the second substrate 220 and the first substrate 202. An orthogonal projection of the wavelength conversion layer 226a on the first substrate 202 overlaps with the orthogonal projection of the light emitting device 210a on the first substrate 202. An orthogonal projection of the wavelength conversion layer 226b on the first substrate 202 overlaps with the orthogonal projection of the light emitting device 210b on the first substrate 202. Likewise, a color filter layer 228a and a color filter layer 228b may be separately disposed at the second substrate 220 and the first substrate 202. An orthogonal projection of the color filter layer 228a on the first substrate 202 overlaps with the orthogonal projection of the light emitting device 210a on the first substrate 202. An orthogonal projection of the color filter layer 228b on the first substrate 202 overlaps with the light emitting device 210b on the first substrate 202. More particularly, the wavelength conversion layer 226a may be located between the color filter layer 228a and the second substrate 220, and the wavelength conversion layer 226b may be located between the color filter layer 228b and the first substrate 202.

Referring to FIG. 13 and FIG. 15 together, a display apparatus 50O shown in FIG. 15 is similar to the display apparatus 50M in FIG. 13. A major difference between the above two is that the second substrate 220 in FIG. 15 is a protecting glass. In addition, a color filter layer may not be disposed in the present embodiment.

Figure 16:
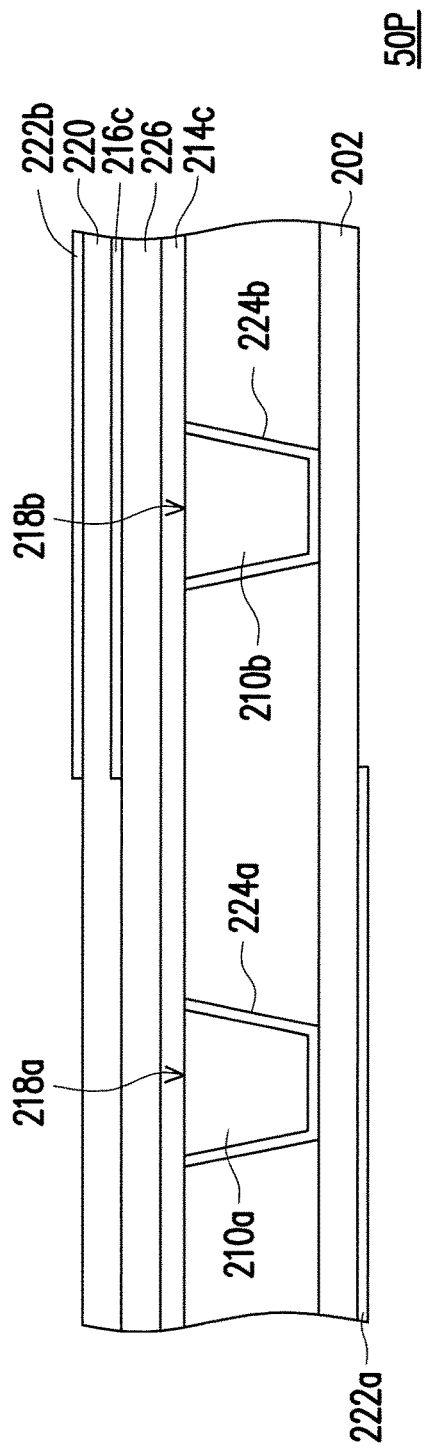

Referring to FIG. 15 and FIG. 16 together, a display apparatus 50P in FIG. 16 is similar to the display apparatus 50O in FIG. 15. A major difference between the above two is that the display apparatus 50P in FIG. 16 further includes the light shielding layer 222b, and the first reflection structure 216c is located between the second substrate 220 and the wavelength conversion layer 226.

Figure 17:
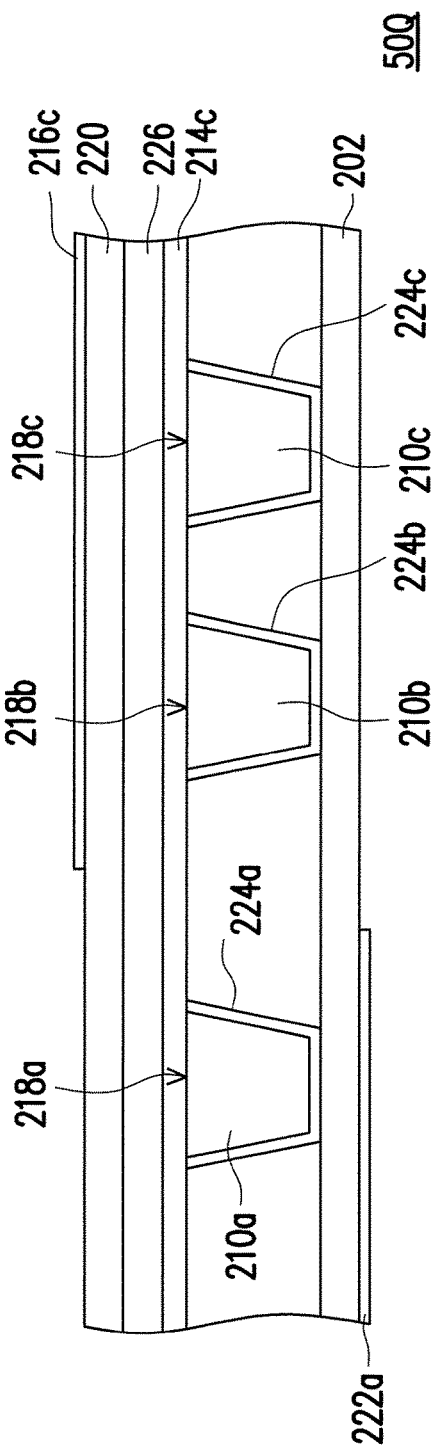

Referring to FIG. 13 and FIG. 17 together, a display apparatus 50Q in FIG. 17 is similar to the display apparatus 50M in FIG. 13. A major difference between the above two is that the display apparatus 50Q in FIG. 17 further includes a light emitting device 210c and a second reflection structure 224c. The light emitting device 210c is adjacent to the light emitting device 210b. The second reflection structure 224c covers the light emitting device 210c, while exposing a light emitting surface 218c of the light emitting device 210c facing the second substrate 202. As similar to the light emitting device 210b and the second reflection structure 224b, the light emitted by the light emitting device 210c is reflected by the first reflection structure 216c, and then emitted from the first substrate 202. By simultaneously disposing the light emitting device 210b and the light emitting device 210c, illumination efficiency of the display apparatus 50Q toward the first substrate 202 may be improved.

FIG. 18 to FIG. 28 are schematic partial cross-sectional views of display apparatuses according to several embodiments of the disclosure. In these embodiments, both of a light emitting device 234a and a light emitting device 234b are flip-chip LEDs.

Figure 18:
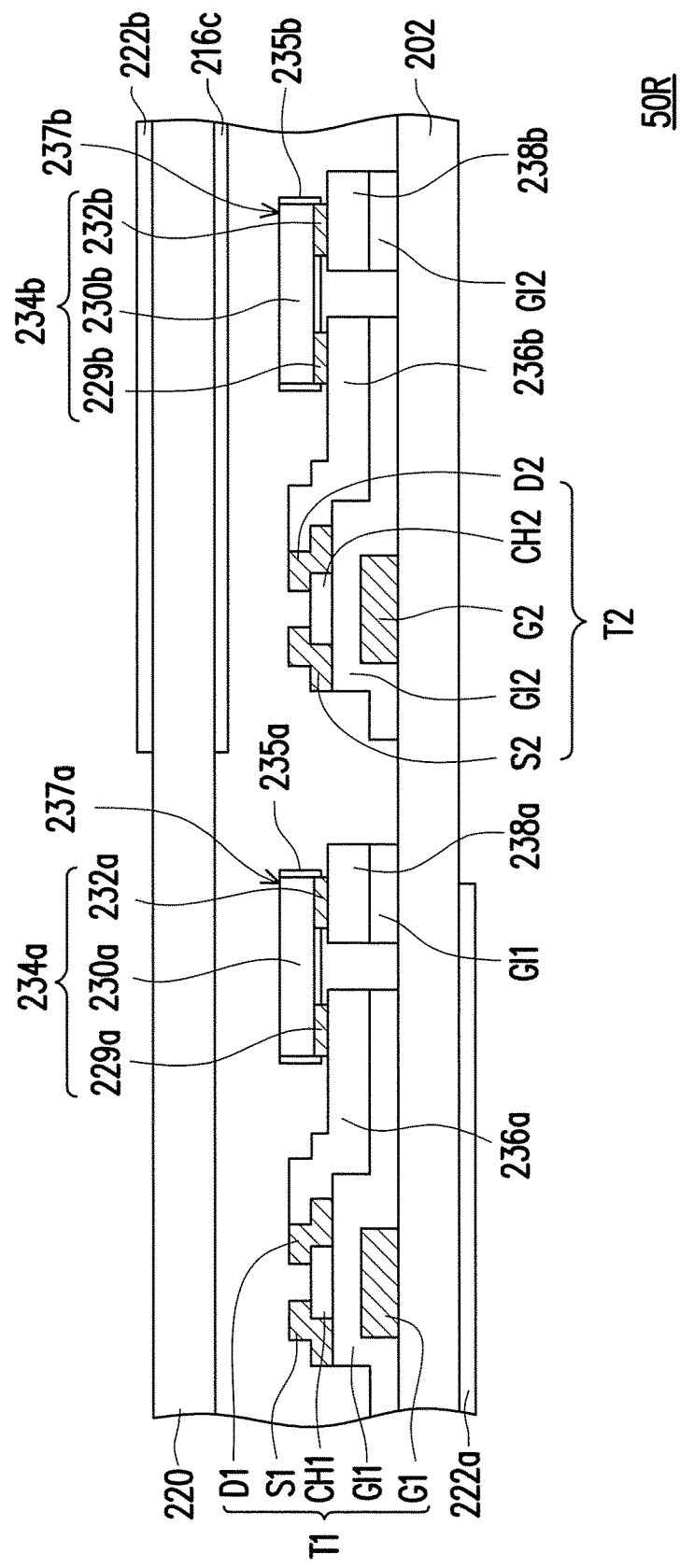

Referring to FIG. 18, the light emitting device 234a may include an electrode 229a, a light emitting structure 230a and an electrode 232a. The electrode 229a and the electrode 232a are separately disposed on the gate insulating layer GI1, and the light emitting structure 230a is disposed on the electrode 229a and the electrode 232a. The light emitting structure 230a may include the P-type semiconductor layer, the multiple quantum well structure, and the N-type semiconductor layer as shown in FIG. 5, which are omitted from illustration herein. Likewise, the light emitting device 234b may include an electrode 229b, a light emitting structure 230b and an electrode 232b. The electrode 229b and the electrode 232b are separately disposed on a gate insulating layer GI2, and the light emitting structure 230b is disposed on the electrode 229b and the electrode 232b. The light emitting structure 230b may include the P-type semiconductor layer, the multiple quantum well structure, and the N-type semiconductor layer as shown in FIG. 5, which are omitted from illustration herein. A second reflection structure 235a covers the light emitting device 234a, while exposing a light emitting surface 237a of the light emitting device 234a. In addition, a second reflection structure 235b covers the light emitting device 234b, while exposing a light emitting surface 237b of the light emitting device 234b.

In addition, a display apparatus 50R may further include a transparent conductive structure 236a and a transparent conductive structure 238a, which are separately disposed between the electrode 229a and the gate insulating layer GI1, and between the electrode 232a and the gate insulating layer GI1, respectively. The transparent conductive structure 236a extends to be electrically connected to a drain D1 and the electrode 229a. Likewise, the display apparatus 50R may also include a transparent conductive structure 236b and a transparent conductive structure 238b, which are separately disposed between the electrode 229b and the gate insulating layer GI2, respectively. The transparent conductive structure 236b extends to electrically connect the drain D2 and the electrode 229b. Since the electrode 229a and the electrode 232a are both disposed on the first substrate 202, a transparent conductive structure may not be disposed at the second substrate 220 of the present embodiment. Likewise, since the electrode 229b and the electrode 232b are both disposed on the first substrate 202, a transparent conductive structure may not be disposed at the second substrate 220 in the present embodiment.

Figure 19:
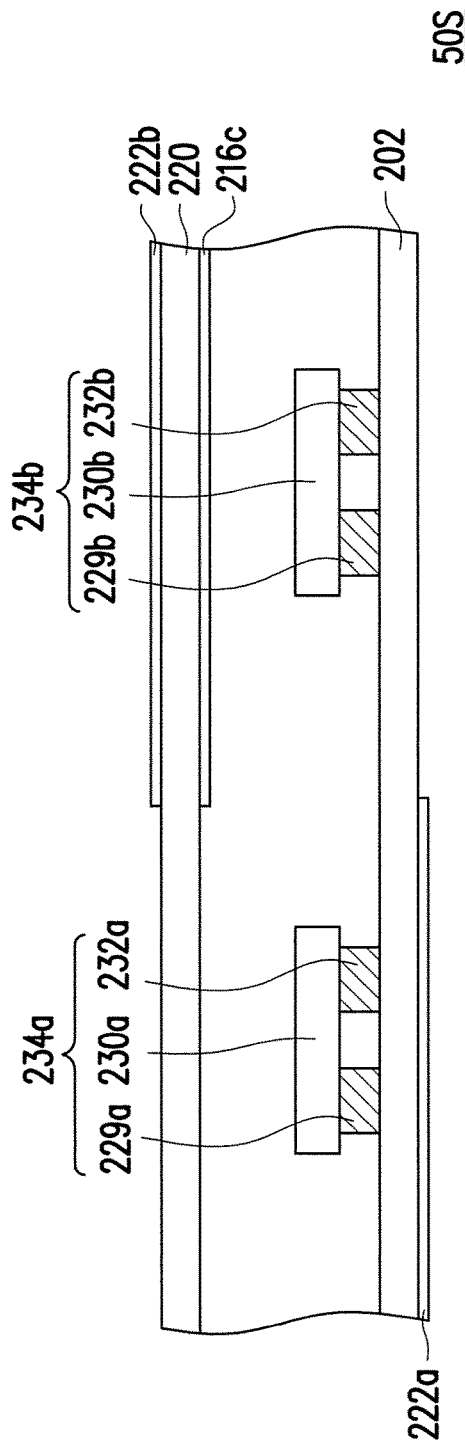

Referring to FIG. 18 and FIG. 19 together, a display apparatus 50S in FIG. 19 is similar to the display apparatus 50R in FIG. 18. A major difference between the above two is that the display apparatus 50S in FIG. 19 may not include the second reflection structure 235a and the second reflection structure 235b as shown in FIG. 18. Besides, for simplicity, the driving device T1, the driving device T2, the transparent conductive structure 236a, the transparent conductive structure 236b, and the transparent conductive structure 238b in FIG. 18 are omitted in FIG. 19.

Figure 20:
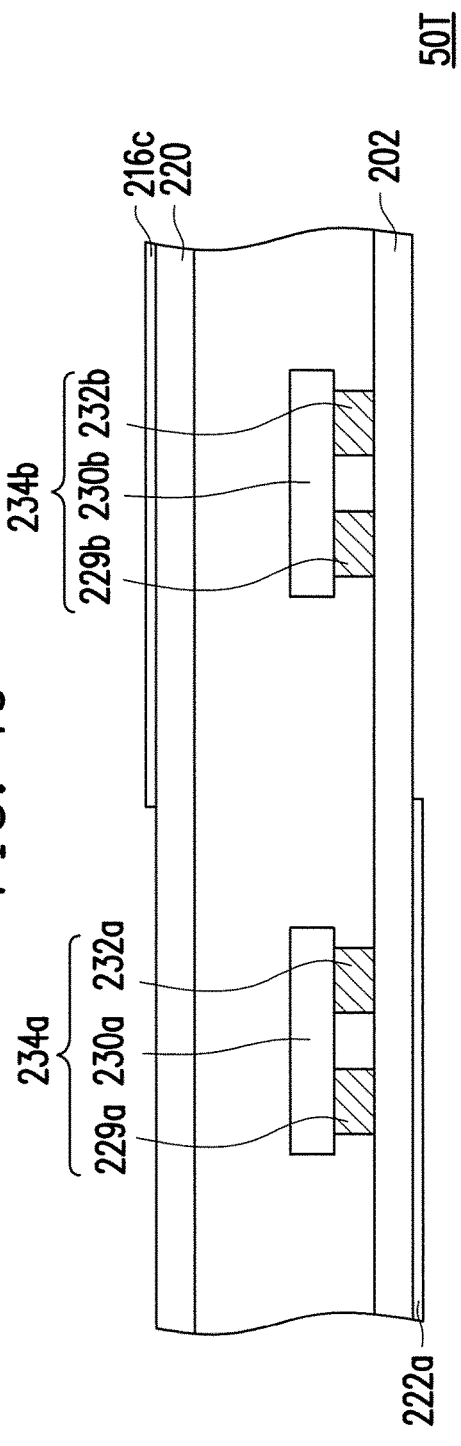

Referring to FIG. 19 and FIG. 20 together, a display apparatus 50T shown in FIG. 20 is similar to the display apparatus 50S in FIG. 19. A major difference between the above two is that the display apparatus 50T in FIG. 20 may not include the light shielding layer (such as the light shielding layer 222b shown in FIG. 19) disposed on the second substrate 220, and the second substrate 220 may be located between the first reflection structure 216c and the light emitting device 234b.

Figure 21:
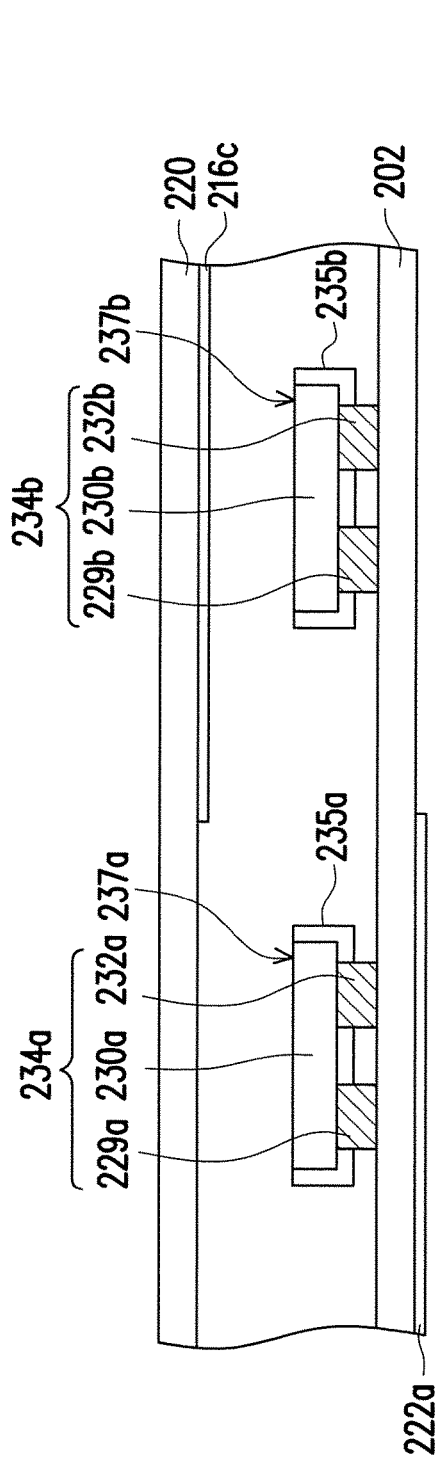

Referring to FIG. 20 and FIG. 21 together, a display apparatus 50U in FIG. 21 is similar to the display apparatus 50T in FIG. 20. A major difference between the above two is that display apparatus 50U in FIG. 21 further includes the second reflection structure 235a and the second reflection structure 235b, and the first reflection structure 216c is located between the second substrate 220 and the light emitting device 234b. The second reflection structure 235a covers the light emitting device 234a, while exposing the light emitting surface 237a of the light emitting device 234a facing the second substrate 220. The second reflection structure 235b covers the light emitting device 234b, while exposing the light emitting surface 237b of the light emitting device 234b facing the second substrate 220.

Figure 22:
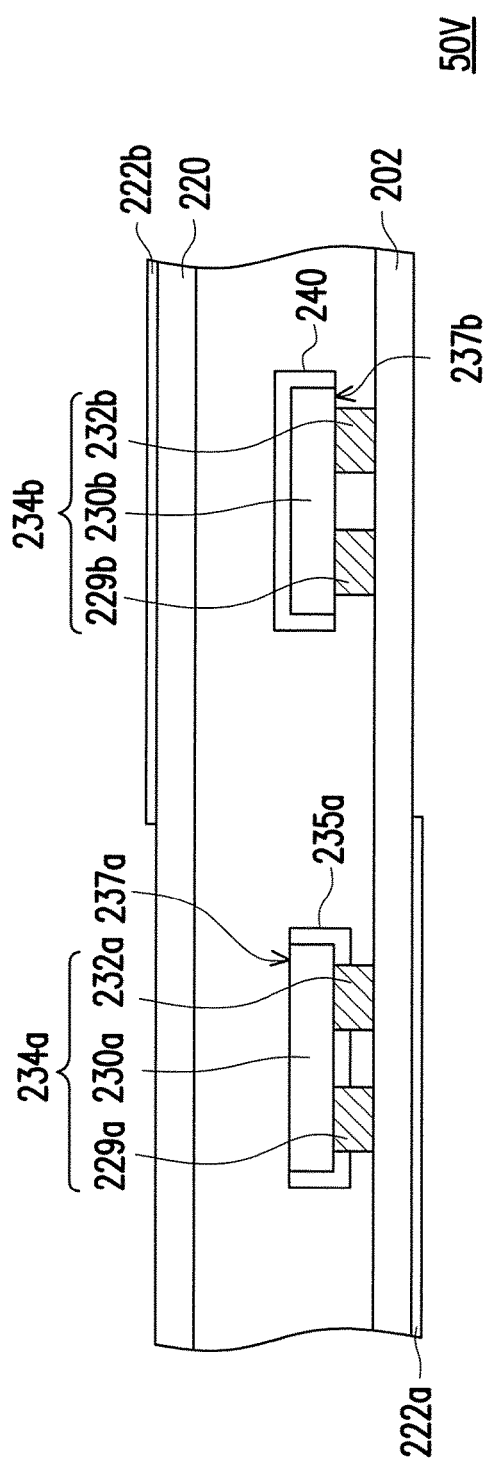

Referring to FIG. 19 and FIG. 22 together, a display apparatus 50V in FIG. 22 is similar to the display apparatus 50S in FIG. 22. A major difference between the above two is that display apparatus 50V in FIG. 22 further includes the second reflection structure 235a and the first reflection structure 240. The second reflection structure 235a covers the light emitting device 234a, while exposing the light emitting surface 237a of the light emitting device 234a facing the second substrate 220. The first reflection structure 240 covers the light emitting device 234b, while exposing the light emitting surface 237b of the light emitting device 234b facing the second substrate 202. Therefore, in one embodiment, the light shielding layer 222b is optionally disposed at the second substrate 220 depending on the reflectivity of the first reflection structure 240.

Referring to FIG. 20 and FIG. 23 together, a display apparatus 50W in FIG. 23 is similar to the display apparatus 50T in FIG. 20. A major difference between the above two is that display apparatus 50W in FIG. 23 further includes a wavelength conversion layer 242a and a wavelength conversion layer 242b. The wavelength conversion layer 242a may be disposed on a surface of the light emitting device 234a facing the second substrate 220, and the wavelength conversion layer 242b may be disposed on a surface of the light emitting device 234b facing the second substrate 220. In addition, the first reflection structure 216c in FIG. 23 is disposed between the second substrate 220 and the light emitting device 234b.

Referring to FIG. 20 and FIG. 24 together, a display apparatus 50X in FIG. 24 is similar to the display apparatus 50T in FIG. 20. A major difference between the above two is that the display apparatus 50X in FIG. 24 further includes a wavelength conversion layer 244, which may be disposed at the second substrate 220. An orthogonal projection of the wavelength conversion layer 244 on the first substrate 202 overlaps with orthogonal projections of the light emitting device 234a and the light emitting device 234b on the first substrate 202. More particularly, the second substrate 220 may be located between the first reflection structure 216c and the wavelength conversion layer 244, and the wavelength conversion layer 244 may be located between the second substrate 220 and the light emitting device 234b.

Referring to FIG. 19 and FIG. 25 together, a display apparatus 50Y in FIG. 25 is similar to the display apparatus 50S in FIG. 19. A major difference between the above two is that the display apparatus 50Y in FIG. 25 further includes a wavelength conversion layer 246a and a wavelength conversion layer 246b. The wavelength conversion layer 246a is disposed at the second substrate 220, and is located between the second substrate 220 and the light emitting device 234a, so that an orthogonal projection of the wavelength conversion layer 246a on the first substrate 202 overlaps with an orthogonal projection of the light emitting device 234a on the first substrate 202. The wavelength conversion layer 246b is disposed on the first substrate 202, and the first substrate 202 is located between the light emitting device 234b and the wavelength conversion layer 246b, such that an orthogonal projection of the wavelength conversion layer 246b on the first substrate 202 overlaps with an orthogonal projection of the light emitting device 234b on the first substrate 202.

Referring to FIG. 21 and FIG. 26 together, a display apparatus 50Z in FIG. 26 is similar to the display apparatus 50U in FIG. 21. A major difference between the above two is that the display apparatus 50Z in FIG. 26 further includes a wavelength conversion layer 248 and a color filter layer 250, which are disposed at the second substrate 220. More particularly, the color filter layer 250 may be located between the second substrate 220 and the wavelength conversion layer 248, and an orthogonal projection of the color filter layer 250 on the first substrate 202 overlaps with the orthogonal projections of the light emitting device 234a and the light emitting device 234b on the first substrate 202. Besides, the second substrate 220 may be located between the first reflection structure 216c and the color filter layer 250.

Figure 27:
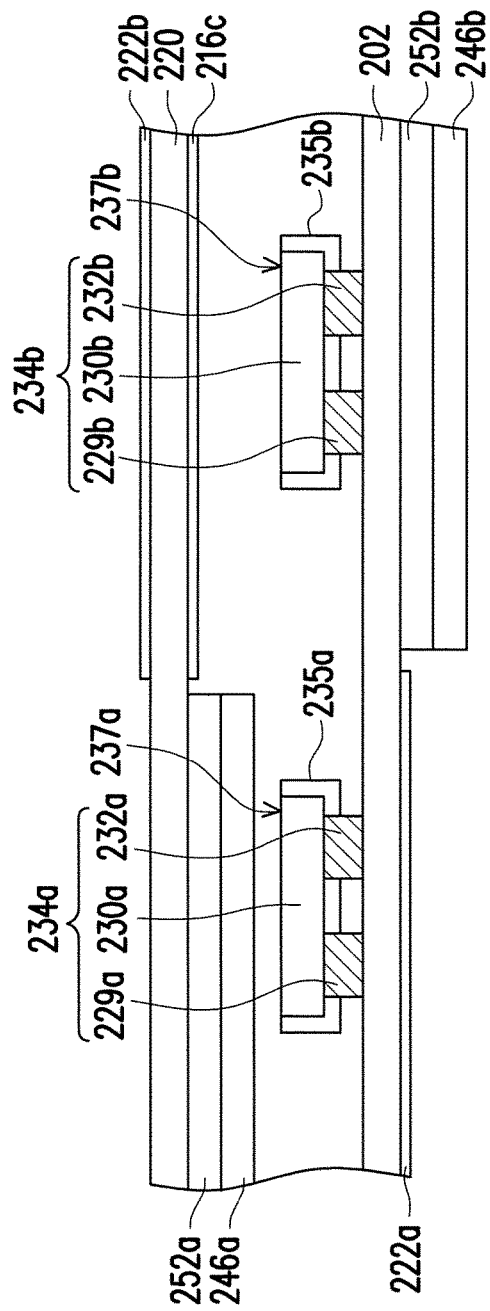

Referring to FIG. 25 and FIG. 27 together, a display apparatus 60A in FIG. 27 is similar to the display apparatus 50Y in FIG. 25. A major difference of the above two is that the display apparatus 60A in FIG. 27 further includes the second reflection structure 235a, the second reflection structure 235b, a color filter layer 252a, and a color filter layer 252b. The second reflection structure 235a may cover the light emitting device 234a, while exposing the light emitting surface 237a of the light emitting device 234a facing the second substrate 220. The second reflection structure 235b covers the light emitting device 234b, while exposing the light emitting surface 237b of the light emitting device 234b facing the second substrate 220. The color filter layer 252a and the color filter layer 252b are respectively disposed at the second substrate 220 and the first substrate 202. More particularly, the color filter layer 252a is located between the second substrate 220 and the wavelength conversion layer 246a, and the color filter layer 252b is located between the first substrate 202 and the wavelength conversion layer 246b.

Figure 28:
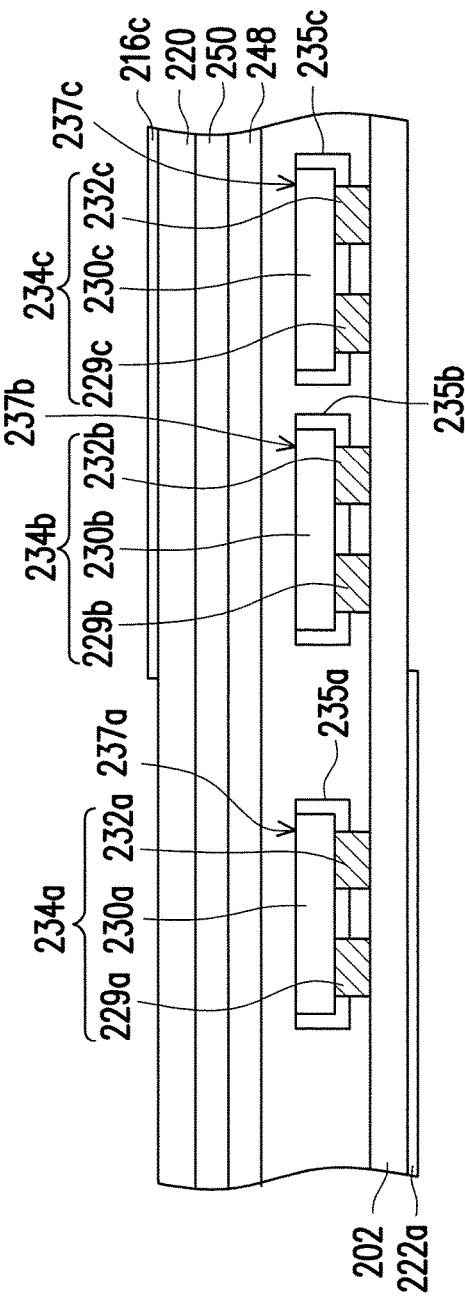

Referring to FIG. 26 and FIG. 28 together, a display apparatus 60B in FIG. 28 and the display apparatus 50Z in FIG. 26. A major difference of the above two is that the display apparatus 60B in FIG. 28 further includes a light emitting device 234c and a second reflection structure 235c. The light emitting device 234c is adjacent to the light emitting device 234b. The second reflection structure 235c covers the light emitting device 234c, while exposing a light emitting surface 237c of the light emitting device 234c facing the second substrate 220. As similar to the light emitting device 234b, the light emitting device 234c also includes an electrode 228c, a light emitting structure 230c and an electrode 232c. By disposing both of the light emitting device 234*b* and the light emitting device 234*c* in the display apparatus 60B, illumination efficiency of the display apparatus 60B toward the first substrate 202 may be improved.

In summary of the above, the light emitted by the light emitting device can be reflected by the first reflection structure, and then emitted outward from the first substrate. In this way, the design of the present embodiment is advantageous for readily changing the light emission direction of the light emitting device, such that the display apparatus is more likely to meets different design requirements. On the other hand, through the aforementioned design, the present embodiment may be applied to a large size display apparatus.

Although the disclosure has been disclosed by the embodiments as above, the embodiments are not intended to limit the disclosure. People having ordinary skill in the art can make some changes and modifications without departing from the spirit and the scope of the disclosure. Therefore, the protected scope of the disclosure shall be defined by the attached claims.

What is claimed is:

1. A display apparatus, comprising:
   a first substrate;
   a light emitting device, disposed on the first substrate, wherein a height of the light emitting device is greater than or equal to 1 μm and less than or equal to 20 μm;
   a first reflection structure, disposed corresponding to the light emitting device; and
   a first insulating layer, located between the first substrate and the first reflection structure, wherein the first insulating layer has an opening, the light emitting device is disposed at the opening,
   wherein at least a portion of a light emitted by the light emitting device is reflected by the first reflection structure, and then emitted through the first substrate, and
   wherein an angle between a side wall of the opening and the first substrate is greater than or equal to 60° and less than or equal to 150°.

2. The display apparatus as claimed in claim 1, further comprising a driving device disposed on the first substrate, wherein the light emitting device is staggered with the driving device.

3. The display apparatus as claimed in claim 1, wherein the light emitting device is a flip-chip light emitting diode or a vertical light emitting diode.

4. The display apparatus as claimed in claim 1, further comprising a wavelength conversion layer disposed on one side of the first substrate, wherein an orthogonal projection of the wavelength conversion layer on the first substrate at least partially overlaps with an orthogonal projection of the light emitting device on the first substrate.

5. The display apparatus as claimed in claim 4, wherein the wavelength conversion layer is a phosphor powder layer, a fluorescent powder layer, a quantum dot layer, or a combination thereof.

6. The display apparatus as claimed in claim 5, wherein the first substrate has a recess, and the wavelength conversion layer is located in the recess.

7. The display apparatus as claimed in claim 1, further comprising a color filter layer disposed on one side of the first substrate, wherein an orthogonal projection of the color filter layer on the first substrate at least partially overlaps with an orthogonal projection of the light emitting device on the first substrate.

8. The display apparatus as claimed in claim 1, further comprising a second insulating layer covering the light emitting device and the first insulating layer.

9. A display apparatus, comprising:
   a first substrate;
   a second substrate,
   a light emitting device, disposed between the first substrate and the second substrate, wherein a height of the light emitting device is greater than or equal to 1 μm and less than or equal to 20 μm,
   a light shielding layer, disposed on one side of the second substrate, wherein an orthogonal projection of the light shielding layer on the first substrate overlaps with an orthogonal projection of the light emitting device on the first substrate; and
   a first reflection structure, disposed between the light shielding layer and the light emitting device,
   wherein at least a portion of a light emitted by the light emitting device is reflected by the first reflection structure, and then emitted through the first substrate.

10. The display apparatus as claimed in claim 9, wherein quantity of the light emitting device is plural, a part of the light emitting devices emit light toward the first substrate, and the other part of the light emitting devices emit light toward the second substrate.

11. The display apparatus as claimed in claim 9, further comprising a wavelength conversion layer disposed at the first substrate or at the second substrate, or covers a light emitting surface of the light emitting device, wherein an orthogonal projection of the wavelength conversion layer on the first substrate at least partially overlaps with an orthogonal projection of the light emitting device on the first substrate.

12. The display apparatus as claimed in claim 9, further comprising a color filter layer disposed at the first substrate or the second substrate, wherein an orthogonal projection of the color filter layer on the first substrate at least partially overlaps with an orthogonal projection of the light emitting device on the first substrate.

13. The display apparatus as claimed in claim 9, wherein the first reflection structure covers the light emitting device while exposing a light emitting surface of the light emitting device, and the light emitting surface of the light emitting device faces the first substrate.

14. The display apparatus as claimed in claim 9, further comprising a second reflection structure, covering the light emitting device while exposing a light emitting surface of the light emitting device, wherein the light emitting surface of the light emitting device faces the second substrate.

15. The display apparatus as claimed in claim 9, further comprising an additional light shielding layer disposed on one side of the first substrate, wherein an orthogonal projection of the additional light shielding layer on the first substrate overlaps with an orthogonal projection of the light emitting device on the first substrate.

* * * * *